(12) United States Patent
Lin et al.

(10) Patent No.: US 11,855,093 B2
(45) Date of Patent: Dec. 26, 2023

(54) SEMICONDUCTOR DEVICES AND METHODS OF MANUFACTURING THEREOF

(71) Applicant: Taiwan Semiconductor Manufacturing Company Limited, Hsinchu (TW)

(72) Inventors: Shih-Yao Lin, New Taipei (TW); Chao-Cheng Chen, Hsinchu (TW); Chih-Han Lin, Hsinchu (TW); Ming-Ching Chang, Hsinchu (TW); Wei-Liang Lu, Hsinchu (TW); Kuei-Yu Kao, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 172 days.

(21) Appl. No.: 17/371,970

(22) Filed: Jul. 9, 2021

(65) Prior Publication Data
US 2023/0011293 A1  Jan. 12, 2023

(51) Int. Cl.
*H01L 27/092* (2006.01)
*H01L 29/78* (2006.01)
*H01L 21/8234* (2006.01)
*H01L 29/66* (2006.01)

(52) U.S. Cl.
CPC .. *H01L 27/0924* (2013.01); *H01L 21/823431* (2013.01); *H01L 29/6656* (2013.01); *H01L 29/6681* (2013.01); *H01L 29/7851* (2013.01)

(58) Field of Classification Search
CPC ......... H01L 27/0924; H01L 21/823431; H01L 29/6656; H01L 29/6681; H01L 29/7851
See application file for complete search history.

(56) References Cited

U.S. PATENT DOCUMENTS

| 2016/0087098 A1* | 3/2016 | Liu ................... H01L 29/42364 257/344 |
| 2019/0326300 A1* | 10/2019 | Liaw ...................... H10B 10/12 |
| 2020/0219993 A1* | 7/2020 | Cheng ................. H01L 27/0886 |
| 2021/0280682 A1* | 9/2021 | You ..................... H01L 29/7853 |

* cited by examiner

*Primary Examiner* — Christine A Enad
(74) *Attorney, Agent, or Firm* — FOLEY & LARDNER LLP

(57) ABSTRACT

A semiconductor device includes a substrate. The semiconductor device includes a fin that is formed over the substrate and extends along a first direction. The semiconductor device includes a gate structure that straddles the fin and extends along a second direction perpendicular to the first direction. The semiconductor device includes a first source/drain structure coupled to a first end of the fin along the first direction. The gate structure includes a first portion protruding toward the first source/drain structure along the first direction. A tip edge of the first protruded portion is vertically above a bottom surface of the gate structure.

20 Claims, 20 Drawing Sheets

SEMICONDUCTOR DEVICES AND METHODS OF MANUFACTURING THEREOF

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
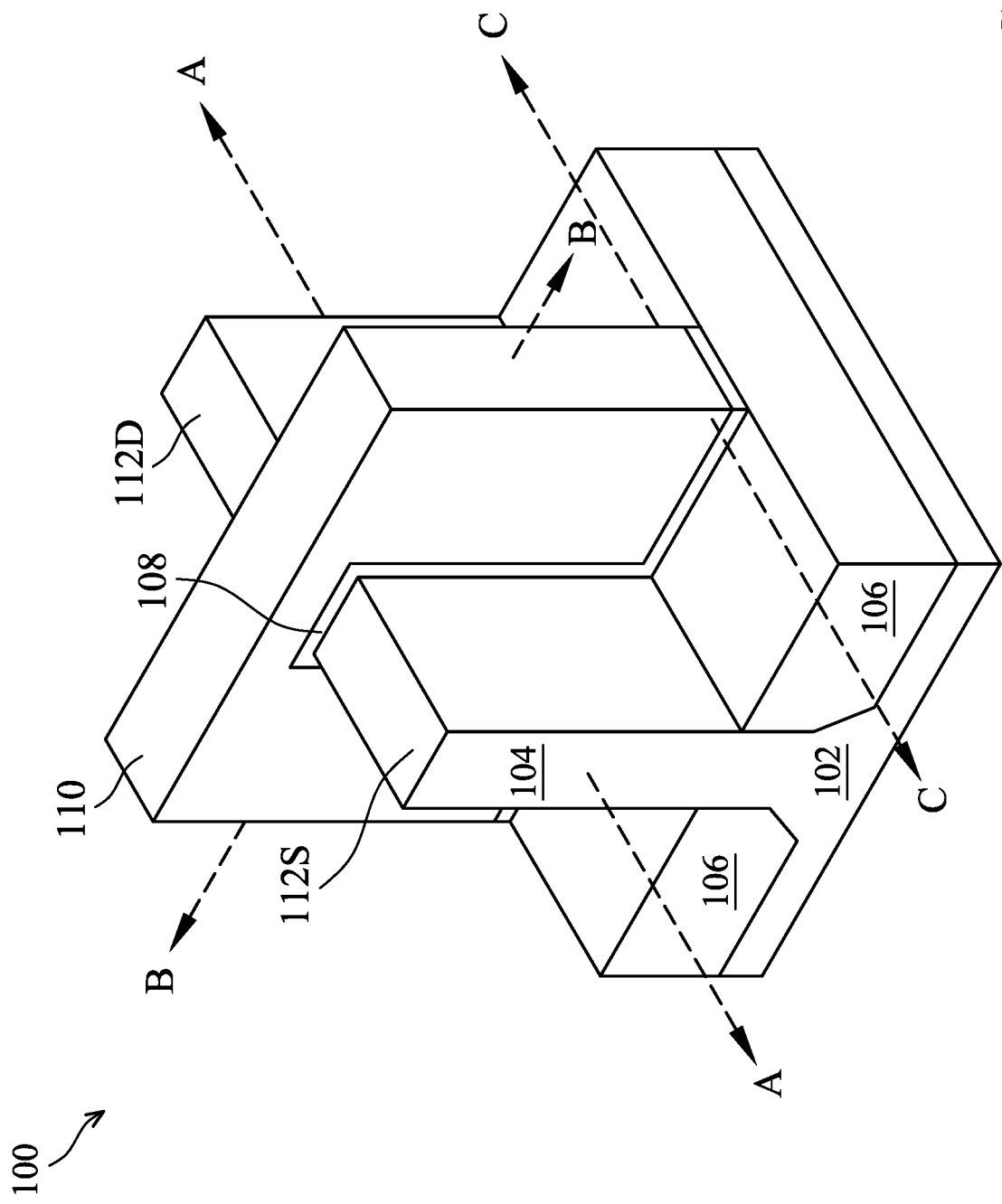
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is discussed in the context of forming a Fin Field-Effect Transistor (FinFET) device, and in particular, in the context of forming a replacement gate of a FinFET device. In general, a blanket dummy gate structure is formed over a fin. Next, the blanket dummy gate structure is patterned as a number of dummy gate structures, each of which straddles a respective portion of the fin. Such dummy gate structures may be formed in the area of a semiconductor substrate where a density of formed transistors is relatively low (e.g., sparsely formed from each other). Accordingly, adjacent ones of the dummy gate structures may be separated by a relatively large spacing, when compared to the spacing between adjacent dummy gate structures in an area where a density of formed transistors is relatively high (e.g., densely formed from each other). The existing technologies commonly suffer undesirable lateral etching at bottom portions of the dummy gate structures that are to be sparsely formed, which causes the dummy gate structures to have their respective tip edges pointing opposite from each other. This may be due to the high (and sometimes less controllable) etching rate when etching the portion of the blanket dummy gate structure between the sparsely formed dummy gate structure. Such opposite-pointed tip edges of the dummy gate structures in turn reduces the respective critical dimensions of active gate structures that will replace the dummy gate structures. Thus, the existing technologies for forming replacement gates are not entirely satisfactory.

The present disclosure provides various embodiments of semiconductor devices and methods of forming the same, which are free from the issues identified in the existing technologies. In various embodiments, when patterning blanket dummy gate structures over the sparse area and the dense area, the blanket dummy gate structures are respectively patterned as intermediate dummy gates that are characterized with different profiles. For example, in the dense area, the intermediate dummy gate may have a recess (between two dummy gate structures-to-be), with the angle between any of its sidewalls and its bottom surface nearly fixed at a certain degree; and in the sparse area, the intermediate dummy gate may also have a recess (between two dummy gate structures-to-be), with the angle between any of its sidewalls and its bottom surface varied while moving along the bottom surface. After the dummy gate structures are formed, the adjacent dummy gate structures in both the dense area and sparse area can have their respective tip edges pointing to each other. As such, the respective critical dimensions of active gate structures replacing the dummy gate structures will not be disadvantageously reduced.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of a portion of the fin 104, and a gate 110 is over the gate dielectric 108. Source structure 112S and drain structure 112D are in (or extended from) the fin 104 and on opposing sides of the gate dielectric 108 and the gate 110. In the following discussions, the gate dielectric 108 and gate 110, collectively, may sometimes be referred to as a dummy gate structure, or an active gate structure that replaces the dummy gate structure. FIG. 1 is provided as a reference to illustrate a number of cross-sections in subsequent figures.

For example, cross-section B-B extends along a longitudinal axis of the gate 110 of the FinFET device 100; cross-section A-A is perpendicular to cross-section B-B and is along a longitudinal axis of the fin 104 and in a direction of, for example, a current flow between the source/drain structures 112S/112D; and cross-section C-C is parallel to cross-section A-A and extends across a portion of the gate dielectric 108 and the gate 110 that is not over the fin 104. Subsequent figures refer to these reference cross-sections for clarity.

Figure 2:
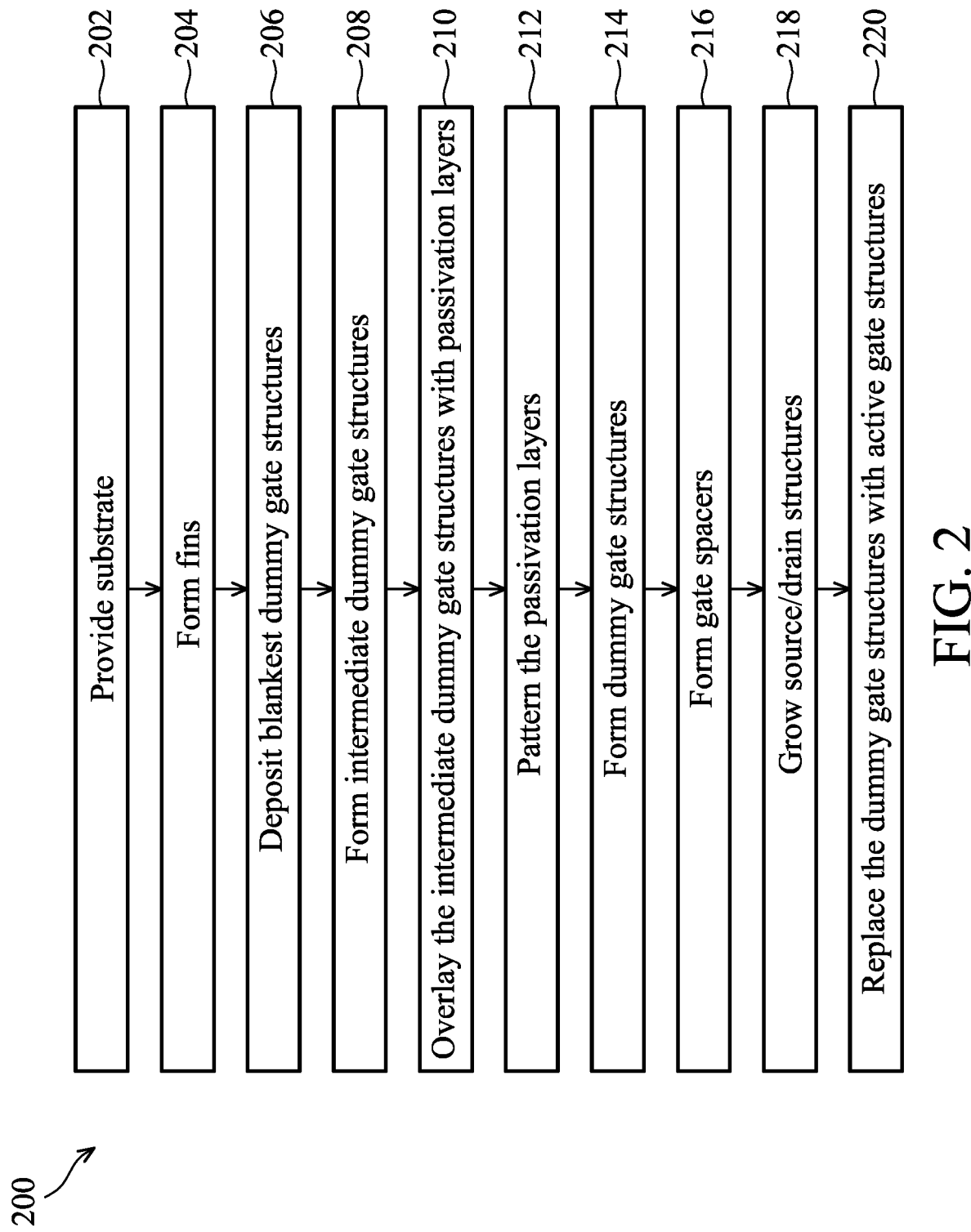
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., FinFET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5A, 5B, 6A, 6B, 7A, 7B, 8A, 8B, 9A, 9B, 10A, 10B, 11A, 11B, 12A, and 12B, respectively, which will be discussed in further detail below.

In brief overview, the method 200 starts with operation 202 of providing a substrate. The method 200 continues to operation 204 of forming fins. The method 200 continues to operation 206 of depositing blanket dummy gate structures. The method 200 continues to operation 208 of forming intermediate dummy gates. The method 200 continues to operation 210 of overlaying the intermediate dummy gates with respective passivation layers. The method 200 continues to operation 212 of patterning the passivation layers. The method 200 continues to operation 214 of forming dummy gate structures based on the patterned passivation layers. The method 200 continues to operation 216 of forming gate spacers. The method 200 continues to operation 218 of growing source/drain structures. The method 200 continues to operation 220 of replacing the dummy gate structures with respective active gate structures.

As mentioned above, FIGS. 3-12B each illustrate, in a cross-sectional view, a portion of a FinFET device 300 at various fabrication stages of the method 200 of FIG. 2. The FinFET device 300 is similar to the FinFET device 100 shown in FIG. 1, but with multiple fins and multiple gate structures. Although FIGS. 3-12B illustrate the FinFET device 300, it is understood the FinFET device 300 may include a number of other devices such as inductors, fuses, capacitors, coils, etc., which are not shown in FIGS. 3-12B, for purposes of clarity of illustration.

Figure 3:
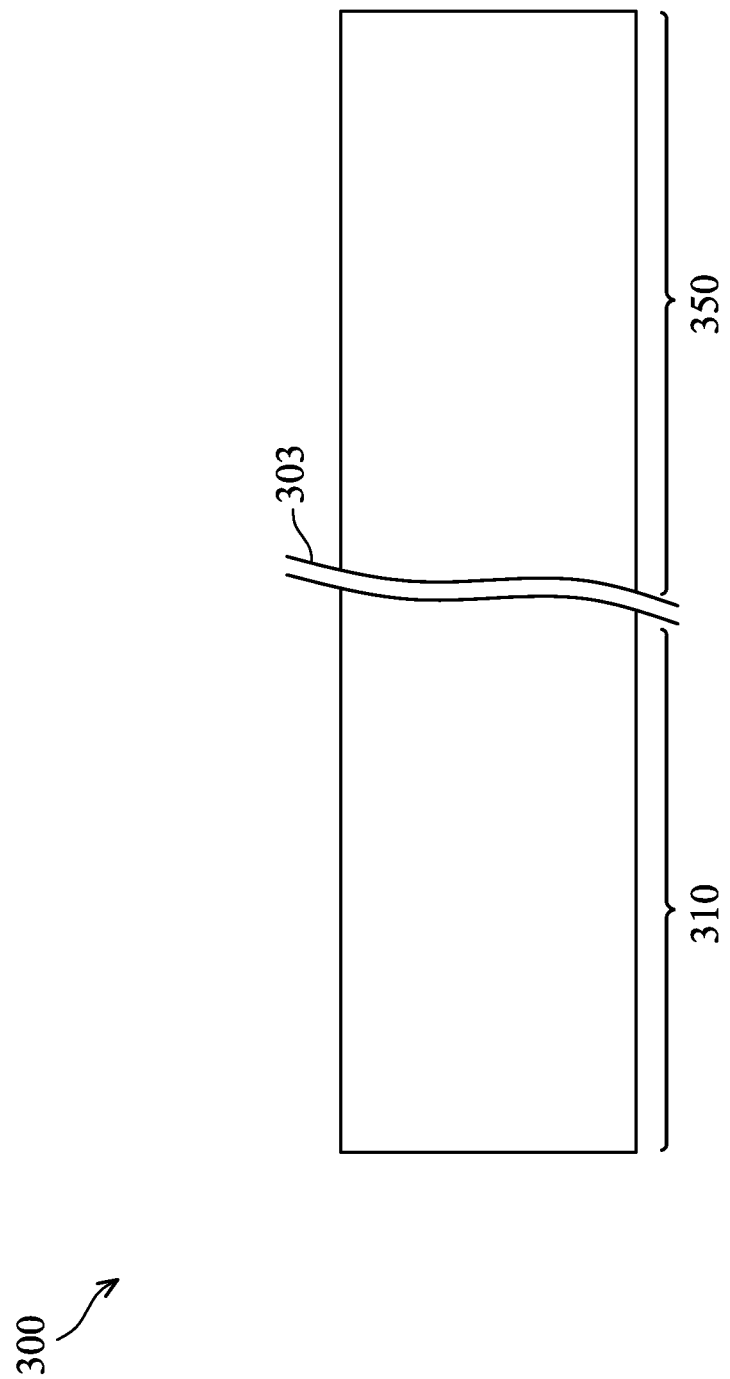
FIGS. 3, 4, 5A, 5B, 6A, 6B, 7A, 7B, 8A, 8B, 9A, 9B, 10A, 10B, 11A, 11B, 12A, and 12B illustrate cross-sectional views of an example FinFET device (or a portion of the example FinFET device) during various fabrication stages, made by the method of FIG. 2, in accordance with some embodiments.

Corresponding to operation 202 of FIG. 2, FIG. 3 is a cross-sectional view of the FinFET device 300 including a semiconductor substrate 302 at one of the various stages of fabrication. The cross-sectional view of FIG. 3 may be cut along the lengthwise direction of an active/dummy gate structure of the FinFET device 300 (e.g., cross-section B-B indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the FinFET device 300 can include areas 310 and 350. The area 310 can be configured to form a number of transistors in relatively high gate density (hereinafter "high density area 310"); and the area 350 can be configured to form a number of transistors in relatively low gate density (hereinafter "low density area 350"). For example, the transistors in the high density area 310 may function as logic circuits, static random access memory (SRAM) circuits, and/or ring oscillators (ROs); and the transistors in the low density area 350 may functions as input/output (I/O) circuits, and/or serializer/deserializer (SerDes). Accordingly, features (e.g., fins) of the transistors in the low density area 350 may be more sparsely formed, when compared to features (e.g., fins) of the transistors formed in the high density area 310.

As shown in FIG. 3 (and the following figures), the high density area 310 and the low density area 350 are separated from each other by a divider 303, which can include additional features/components/devices that are omitted for simplicity. It should be appreciated that some of the operations of the method 200 may be concurrently performed in high density area 310 and the low density area 350. For purposes of illustration, some of the feature(s) formed in the high density area 310 and the low density area 350 are hereinafter shown in the same figure that corresponds to one of the operations of the method 200.

Figure 4:
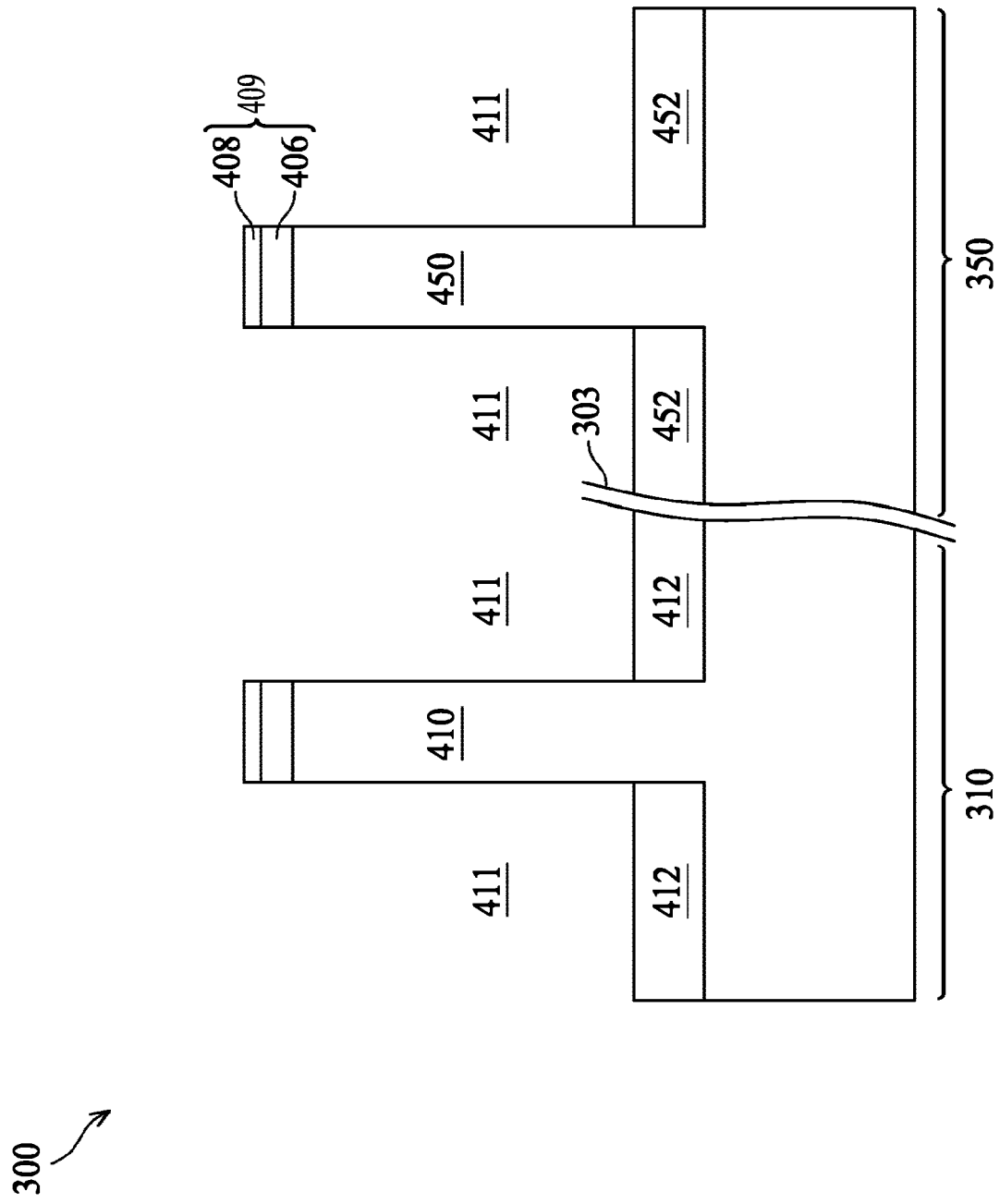

Corresponding to operation 204 of FIG. 2, FIG. 4 is a cross-sectional view of the FinFET device 300 including a fin 410 in the high density area 310 and a fin 450 in the low density area 350 at one of the various stages of fabrication. The cross-sectional view of FIG. 4 may be cut along the lengthwise direction of an active/dummy gate structure of the FinFET device 300 (e.g., cross-section B-B indicated in FIG. 1).

The fin 410 formed in the high density area 310, and the fin 450 is formed in the low density area 350. Although one fin is shown in each of the high density area 310 and the low density area 350, it should be appreciated that the FinFET device 300 can include any number of fins in each of the areas 310 and 350 while remaining within the scope of the present disclosure.

The fins 410 and 450 may be each configured as an active fin, which will be adopted as an active (e.g., electrically functional) fin or channel in a completed FinFET device. Further, the fin 410 may be configured as the active channel of a one or more core transistors of the FinFET device 300 (sometimes referred to as active core fin 410); and the fin 450 may be configured as the active channel of one or more input/output (I/O) transistors of the FinFET device 300 (sometimes referred to as active I/O fin 450). In some other embodiments, the fins 410 and 450 may be each configured as a dummy fin, will not be adopted as an active channel to electrically conduct current in a finished FinFET device. When configured as dummy fins, the fins 410 and 450 may be formed of a dielectric material; and when configured as active fins, the fins 410 and 450 may be formed of a semiconductor material. In the following discussions, the fins 410 and 450 are configured as active fins, thereby being sometimes referred to as "semiconductor fin 410" and "semiconductor fin 450," respectively.

The semiconductor fins 410 and 450 are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 409, as illustrated in FIG. 4.

The patterned mask 409 is subsequently used to pattern exposed portions of the substrate 302 to form trenches (or openings) 411, thereby defining the semiconductor fins 410 and 450 between adjacent trenches 411 as illustrated in FIG. 4. When multiple fins are formed, such a trench may be disposed between any adjacent ones of the fins. In some embodiments, the semiconductor fins 410 and 450 are formed by etching trenches in the substrate 302 using, for example, reactive ion etch (RIE), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the semiconductor fins 410 and 450.

The semiconductor fins 410 and 450 may be patterned by any suitable method. For example, the semiconductor fins 410 and 450 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 3 and 4 illustrate an embodiment of forming the semiconductor fins 410 and 450, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the semiconductor fins 410 and 450 that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the semiconductor fins 410 and 450 may include silicon germanium ($Si_xGe_{1-x}$, where x can be between 0 and 1), silicon carbide, pure or pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Upon forming the semiconductor fins 410 and 450, a number of isolation regions 412 and 452 are formed in the high density area 310 and the low density area 350, respectively, as shown in FIG. 4. The isolation regions 412 and 452, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 412 and 452 and a top surface of the fins 410 and 450 that are coplanar (not shown). The patterned mask 409 may also be removed by the planarization process.

In some embodiments, the isolation regions 412 and 452 include a liner, e.g., a liner oxide (not shown), at the interface between each of the isolation regions 412 and 452 and the substrate 302 (semiconductor fins 410 and 450). In some embodiments, the liner oxide is formed to reduce crystalline defects at the interface between the substrate 302 and the isolation regions 412 and 452. Similarly, the liner oxide may also be used to reduce crystalline defects at the interface between the semiconductor fins 410 and 450 and the isolation regions 412 and 452. The liner oxide (e.g., silicon oxide) may be a thermal oxide formed through a thermal oxidation of a surface layer of the substrate 302, although other suitable method may also be used to form the liner oxide.

Next, the isolation regions 412 and 452 are recessed to form shallow trench isolation (STI) regions 412 and 452, as shown in FIG. 4. The isolation regions 412 and 452 are recessed such that upper portions of the fins 410 and 450 protrude from between neighboring STI regions 412 and 452. Respective top surfaces of the STI regions 412 and 452 may have a flat surface (as illustrated), a convex surface, a concave surface (such as dishing), or combinations thereof. The top surfaces of the STI regions 412 and 452 may be formed flat, convex, and/or concave by an appropriate etch. The isolation regions 412 and 452 may be recessed using an acceptable etching process, such as one that is selective to the material of the isolation regions 412 and 452. For example, a dry etch or a wet etch using dilute hydrofluoric (DHF) acid may be performed to recess the isolation regions 412 and 452.

FIGS. 5A-10B illustrate cross-sectional views of the FinFET device 300 at various stages of fabrication to pattern or otherwise form dummy gate structures in the high density area 310 and the low density area 350, respectively. For example, FIGS. 5A, 6A, 7A, 8A, 9A, and 10A illustrate the cross-sectional views of the FinFET device 300 to form a pair of dummy gate structures over the semiconductor fin 410 in the high density area 310; and FIGS. 5B, 6B, 7B, 8B, 9B, and 10B illustrate the cross-sectional views of the FinFET device 300 to form a pair of dummy gate structures over the semiconductor fin 450 in the low density area 350.

Figure 5A:
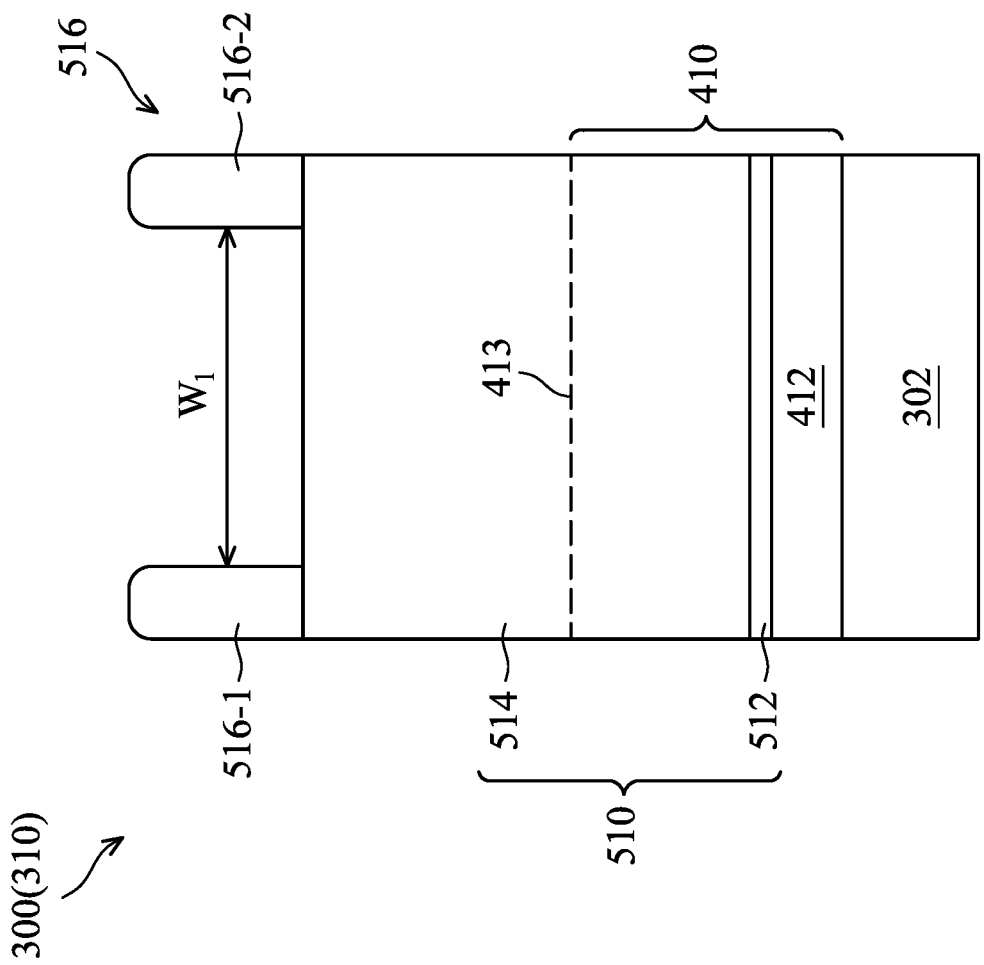
Figure 5B:
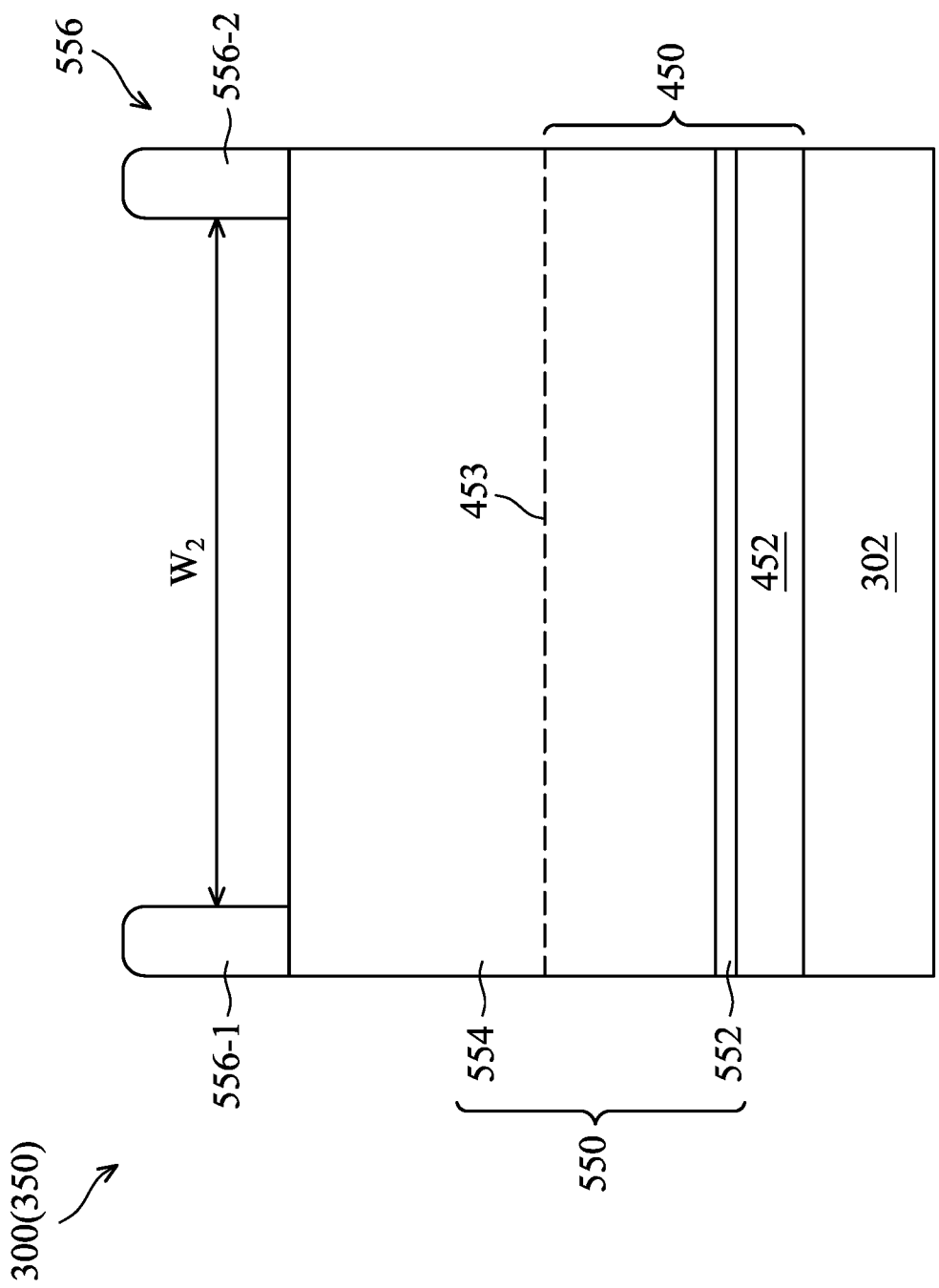

Corresponding to operation 206 of FIG. 2, FIG. 5A is a cross-sectional view of the FinFET device 300 including a blanket dummy gate structure 510 over the semiconductor fin 410 (in the high density area 310), and FIG. 5B is a cross-sectional view of the FinFET device 300 including a blanket dummy gate structure 550 over the semiconductor fin 450 (in the low density area 350), at one of the various stages of fabrication at one of the various stages of fabrication. The cross-sectional views of FIGS. 5A and 5B may be each cut along a direction parallel to the lengthwise direction of a respective semiconductor fin (e.g., cross-section C-C indicated in FIG. 1).

The blanket dummy gate structure 510 is formed over the workpiece (e.g., the partially formed FinFET device 300 in the high density area 310) to overlay the semiconductor fin 410. Thus, the blanket dummy gate structure 510 may have a portion in direct contact with the isolation regions 412, as illustrated in FIG. 5A, and another portion in direct contact with the semiconductor fin 410 (e.g., contacting a top surface and sidewalls of the semiconductor fin 410). For purpose of reference, top surface 413 of the semiconductor fin 410 is indicated by a dotted line in the cross-sectional view of FIG. 5A which does not intersect the semiconductor fin 410. Similarly in FIG. 5B, the blanket dummy gate structure 550 is formed over the low density area 350 to overlay the semiconductor fin 450. Thus, the blanket dummy gate structure 550 may have a portion in direct contact with the isolation regions 452, as illustrated in FIG. 5B, and another portion in direct contact with the semiconductor fin 450 (e.g., contacting a top surface and sidewalls of the semiconductor fin 450). For purpose of reference, top surface 453 of the semiconductor fin 450 is indicated by a dotted line in the cross-sectional view of FIG. 5B which does not intersect the semiconductor fin 450.

The blanket dummy gate structure 510 includes a blanket dummy gate dielectric 512 and a blanket dummy gate 514 (FIG. 5A); and the blanket dummy gate structure 550 includes a blanket dummy gate dielectric 552 and a blanket dummy gate 554 (FIG. 5B), in some embodiments. The blanket dummy gate dielectrics 512 and 552 may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown. The blanket dummy gates 514 and 554 may be, for example, polysilicon (doped or undoped), silicon germanium, or the like, and may be deposited and then planarized, such as by a chemical mechanical polishing (CMP) process.

Upon forming the blanket dummy gate structures 510 and 550 in the high density area and the low density area, a mask layer 516 and a mask layer 556 may be formed over the blanket dummy gate structures 510 and 550, respectively. The mask layers 516 and 556 (sometimes referred to as hard mask layers) may be formed of, for example, silicon nitride or the like. The mask layers 516 and 556 can respectively include one or more patterns configured to define dummy gate structure(s), which will later be replaced with active gate structure(s), through the blanket dummy gate structure. As illustrated in FIG. 5A, the mask layer 516 includes patterns 516-1 and 516-2 that cover two portions of the blanket dummy gate structure 510, which may be later formed as two dummy gate structures in the high density area 310, respectively. As illustrated in FIG. 5B, the mask layer 556 includes patterns 556-1 and 556-2 that cover two portions of the blanket dummy gate structure 550, which may be later formed as two dummy gate structures in the low density area 350, respectively.

In accordance with various embodiments, the patterns 516-1-2 in the high density area 310 may be formed with a spacing $W_1$, and the patterns 556-1-2 in the low density area 350 may be formed with a spacing $W_2$, wherein $W_2$ is greater than $W_1$. For example in a certain process node, $W_1$ may range from about 5 nanometers (nm) to about 50 nm; and $W_2$ may range from about 20 nm to about 1000 nm. In some embodiments, $W_1$ and $W_2$ may have a ratio (e.g., $W_1/W_2$) ranging from about 1.3 to about 200. As such, the transistors can be relatively densely formed in the high density area 310 (partially due to the relatively small spacing between adjacent transistors), and the transistors can be relatively sparsely formed in the low density area 350 (partially due to the relatively large spacing between adjacent transistors).

Figure 6A:
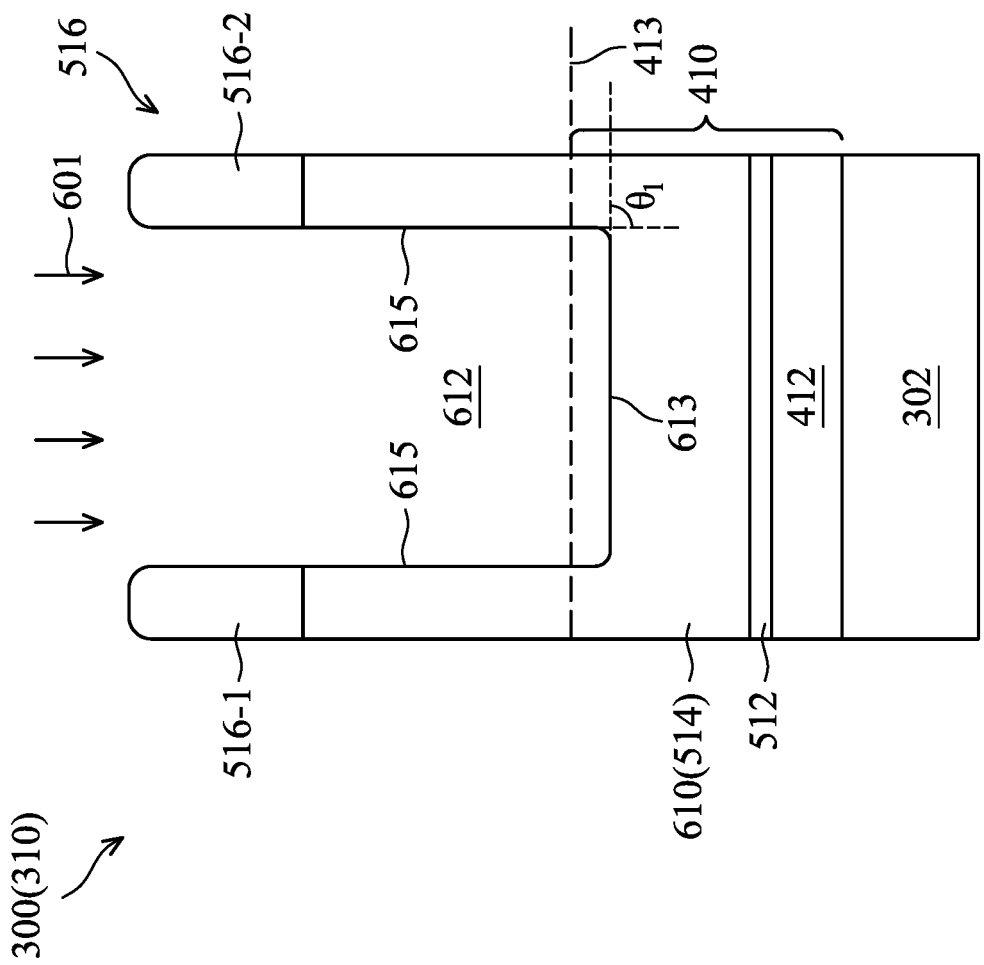
Figure 6B:
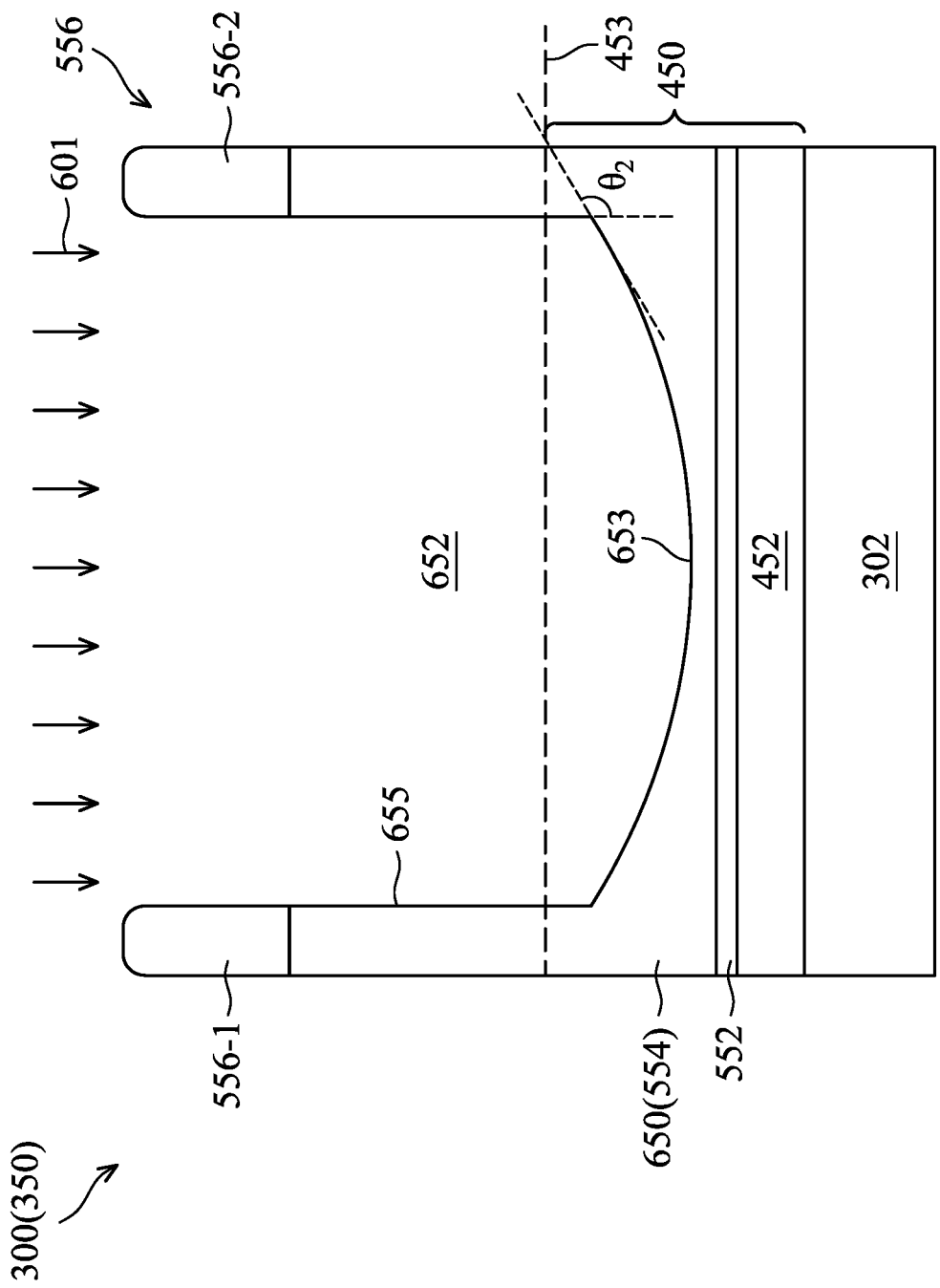

Corresponding to operation 208 of FIG. 2, FIG. 6A is a cross-sectional view of the FinFET device 300 including an intermediate dummy gate 610 over the semiconductor fin 410 (in the high density area 310), and FIG. 6B is a cross-sectional view of the FinFET device 300 including an intermediate dummy gate 650 over the semiconductor fin 450 (in the low density area 350), at one of the various stages of fabrication at one of the various stages of fabrication. The cross-sectional views of FIGS. 6A and 6B may be each cut along a direction parallel to the lengthwise direction of a respective semiconductor fin (e.g., cross-section C-C indicated in FIG. 1).

To form the intermediate dummy gates 610 and 650, an etching process 601 may be performed on the blanket dummy gates 514 and 554, with the patterns 516-1-2 and 556-1-2 as masks, respectively. For example, the etching process 601 can remove a portion of the blanket dummy gate 514 that is not masked or otherwise covered by the patterns 516-1-2 to form the intermediate dummy gate 610 (FIG. 6A), and a portion of the blanket dummy gate 554 that is not masked or otherwise covered by the patterns 516-1-2 to form the intermediate dummy gate 650 (FIG. 6B).

By tuning one or more conditions of the etching process 601, the blanket dummy gate 514, covered by the patterns with a relatively small spacing (e.g., 516-1-2), may experience a greater amount of anisotropic etching than isotropic etching; and the blanket dummy gate 554, covered by the patterns with a relatively large spacing (e.g., 556-1-2), may experience a greater amount of isotropic etching than anisotropic etching. Consequently, the intermediate dummy gate 610 can have a recess 612 with each of its sidewalls and its bottom surface forming a constant angle; and the intermediate dummy gate 650 can have a recess 652 with each of its sidewalls and its bottom surface forming a varying angle.

For example in FIG. 6A, the recess 612 have a bottom surface 613 and sidewalls 615. The sidewalls 615 can be substantially vertical to a top surface of the substrate 302 (e.g., forming an angle about 90±10 degrees). The bottom surface 613 can be formed to be vertically lower than the top surface 413 of the semiconductor fin 410. Further, the sidewall 615 (or its projection) and the bottom surface 613 (or its projection) can form an angle, $\theta_1$, which may fix at about 90 degrees when moving along the bottom surface 613. The recess 612 may sometimes be referred to as having a vertical profile, in some embodiments.

For example in FIG. 6B, the recess 652 have a bottom surface 653 and sidewalls 655. The sidewalls 655 can be substantially vertical to the top surface of the substrate 302 (e.g., forming an angle about 90±10 degrees). The bottom surface 653 can be formed to be vertically lower than the top surface 453 of the semiconductor fin 450. Further, the sidewall 655 (or its projection) and the bottom surface 653 (or its projection) can form an angle, $\theta_2$, which may vary when moving along the bottom surface 653. The recess 652 may sometimes be referred to as having a tapered profile, in some embodiments. According to some embodiments, $\theta_2$ (regardless of how it varies) may be greater than or equal to $\theta_1$.

The etching process 601 can include a plasma etching process, which can have a certain amount of anisotropic characteristic. In such a plasma etching process (including radical plasma etching, remote plasma etching, and other suitable plasma etching processes), etch gases such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable etch gases and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. To cause the intermediate dummy gates 610 (in the high density area 310) and 650 (in the low density area 350) to have the above-described recess profiles, respectively, a ratio of the passivation gas(es) to the etch gas(es) may increase to be greater than a certain threshold, in accordance with various embodiments. For example, the ratio of the passivation gas to the etch gas is about 0.01 to about 10. For the plasma etching process, the etch gases and/or the passivation gases can be diluted with gases such as argon (Ar), helium (He), neon (Ne), and other suitable dilutive gases and combinations thereof to control the above-described etching rates. As a non-limiting example, a source power of about 10 watts to about 3000 watts (to control the ion or radical ratio), a bias power of about 0 watts to about 3000 watts (to control the amount of isotropic etching and/or the amount of anisotropic etching), a pressure of about 1 millitorr to about 800 millitorrs, an etch gas flow of about 1 standard cubic centimeters per minute (sccm) to about 5000 sccm, and a passivation gas flow of about 1 sccm to about 5000 sccom may be used in the etching process 601. However, it is noted that source powers, bias powers, pressures, and flow rates outside of these ranges are also contemplated.

In another example, the etching process 601 can include a wet etching process, which can have a certain amount of isotropic characteristic. In such a wet etching process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof to control the above-described etching process 601.

Figure 7A:
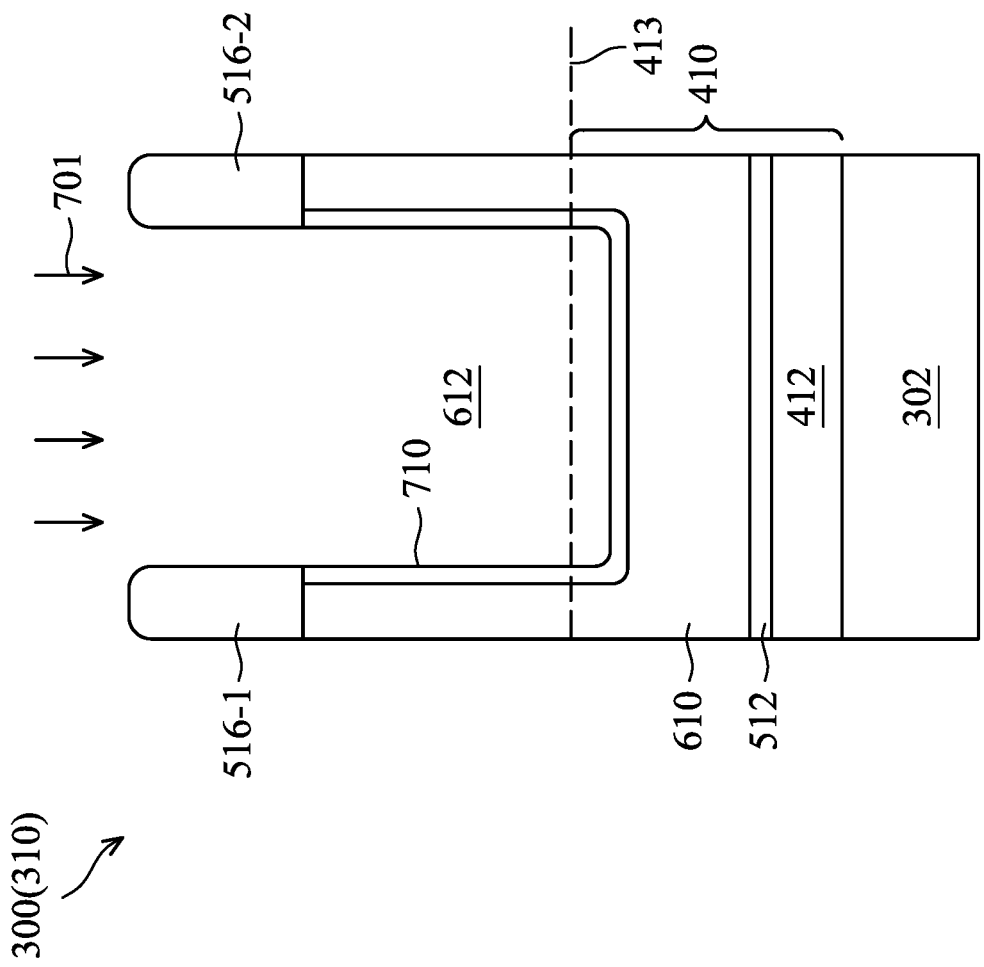
Figure 7B:
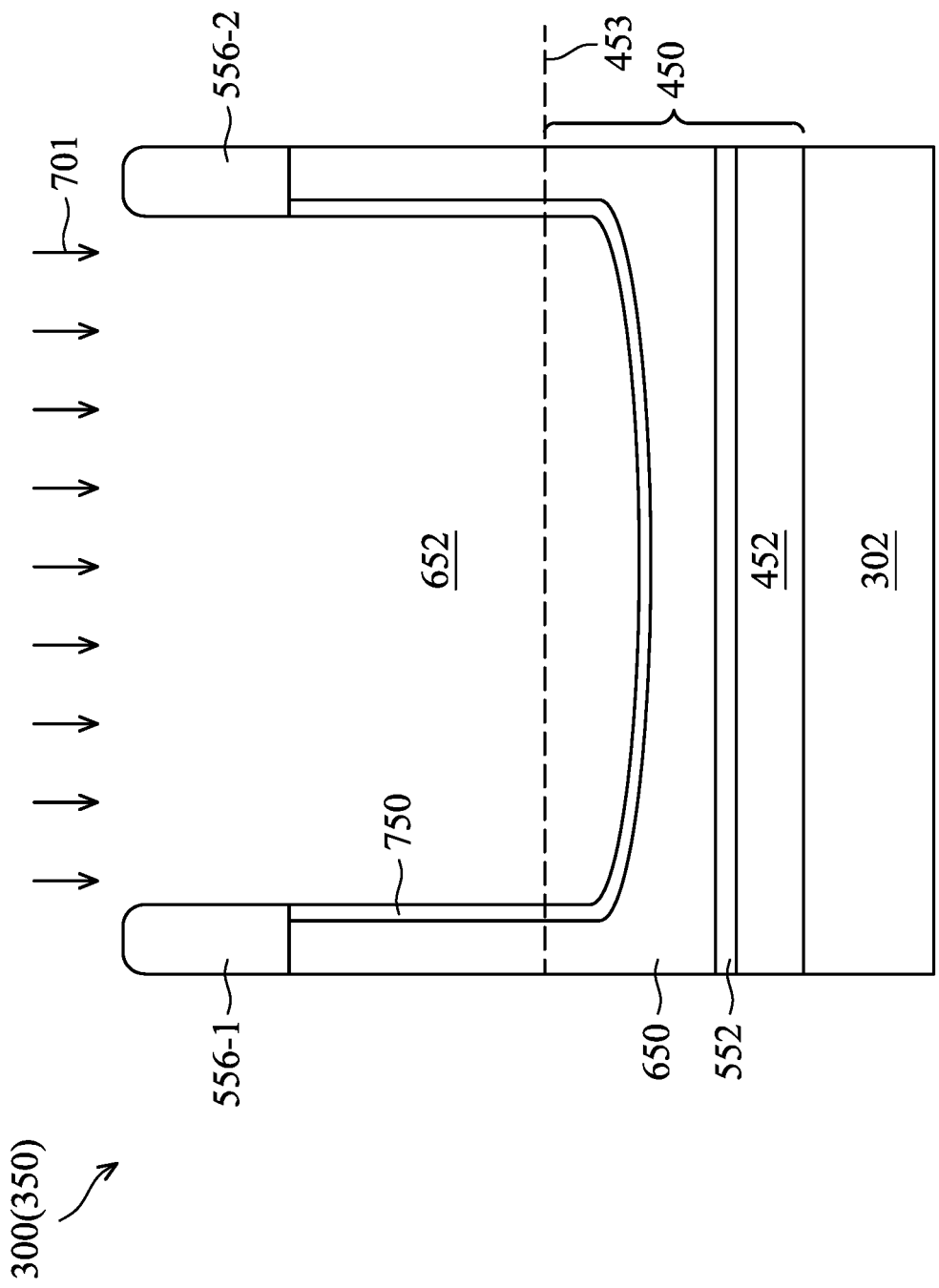

Corresponding to operation 210 of FIG. 2, FIG. 7A is a cross-sectional view of the FinFET device 300 including a passivation layer 710 over the intermediate dummy gate 610 (in the high density area 310), and FIG. 7B is a cross-sectional view of the FinFET device 300 including a passivation layer 750 over the intermediate dummy gate 650 (in the low density area 350), at one of the various stages of fabrication at one of the various stages of fabrication. The cross-sectional views of FIGS. 7A and 7B may be each cut along a direction parallel to the lengthwise direction of a respective semiconductor fin (e.g., cross-section C-C indicated in FIG. 1).

To form the passivation layers 710 and 750, a passivation process 701 may be performed over the intermediate dummy gates 610 and 650, respectively. For example, the passivation process 701 can cause at least an exposed, interfacial, or otherwise upper portion of the intermediate dummy gate 610 to react with gases/chemicals of the passivation process 701 so as to form the passivation layer 710. As such, the passivation layer 710 may be formed in the upper portion of the intermediate dummy gate 610 that lines the recess 612, as illustrated in FIG. 7A. Similarly, the passivation process 701 can cause at least an exposed, interfacial, or otherwise upper portion of the intermediate dummy gate 650 to react with the gases/chemicals of the passivation process 701 so as to form the passivation layer 750. As illustrated in FIG. 7B, the passivation layer 750 may be formed in the upper portion of the intermediate dummy gate 650 that lines the recess 652. In some other embodiments, the passivation layers 710 and 750 may be formed on top of (e.g., instead of being "in") the upper portions of the intermediate dummy gates 610 and 650, respectively.

By tuning one or more conditions (e.g., a bias power) of the passivation process 701, the intermediate dummy gate 610, with the relatively small recess 612, may experience a less amount of anisotropic passivation than isotropic passivation; and the intermediate dummy gate 650, with the relatively large recess 652, may experience a greater amount of anisotropic passivation than isotropic passivation. Consequently, the passivation layer 710 formed in the recess 612 (high density area 310) can have a thinner thickness (e.g., about 0.3-5 nm), when compared to a thickness (e.g., about 0.5-10 nm) of the passivation layer 750 formed in the recess 652 (low density area 350). For example, the thicknesses of the passivation layers 750 and 710 may have a ratio greater than 1. In some embodiments, the higher bias power applied in the passivation process 701, the closer to 1 the ratio (i.e., the thicknesses of the passivation layers 750 and 710 may be close to each other).

The passivation process 701 can include a plasma passivation process, which can have a certain amount of anisotropic characteristic. In such a plasma passivation process (including radical plasma passivation, remote plasma passivation, and other suitable plasma passivation processes), passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof can be used. For the plasma passivation process, the passivation gases can be diluted with gases such as argon (Ar), helium (He), neon (Ne), and other suitable dilutive gases and combinations thereof to control the above-described etching rates. As a non-limiting example, a source power of about 10 watts to about 3000 watts (to control the ion or radical ratio), a bias power of about 0 watts to about 3000 watts (to control the amount of isotropic passivation and/or the amount of anisotropic passivation), a pressure of about 1 millitorr to about 800 millitorrs, and a passivation gas flow of about 1 standard cubic centimeters per minute (sccm) to about 5000 sccm may be used in the passivation process 701. However, it is noted that source powers, bias powers, pressures, and flow rates outside of these ranges are also contemplated. In some embodiments, the plasma passivation process 701 may be in situ or ex situ performed with the etching process 601 (FIGS. 6A-B).

In another example, the passivation process 701 can include a wet passivation process, which can have a certain amount of isotropic characteristic. In such a wet passivation process, a main gas such as ozone ($O_3$), carbon dioxide ($CO_2$), and other suitable main gases and combinations thereof can be used with assistive chemicals such as sulfuric acid ($H_2SO_4$), ammonia ($NH_3$), and other suitable assistive chemicals and combinations thereof as well as solvents such as deionized water, alcohol, acetone, and other suitable solvents and combinations thereof to control the above-described passivation process 701. In some embodiments, the passivation process 701 may be ex situ performed with the etching process 601 (FIGS. 6A-B).

In yet another example, the passivation process 701 can include a deposition process such as, for example, CVD, physical vapor deposition (PVD), atomic layer deposition (ALD), and/or other suitable deposition process. In such a deposition process, the passivation layers 710 and 750 may each be formed as a conformal layer over the respective recess and patterns. The conformal layer may include a dielectric material selected from the group consisting of: silicon nitride (SiN), silicon oxynitride (SiON), silicon oxycarbonitride (SiCON), silicon carbide (SiC), silicon oxycarbide (SiOC), or combinations thereof. In some embodiments, the passivation process 701 may be ex situ performed with the etching process 601 (FIGS. 6A-B).

Figure 8A:
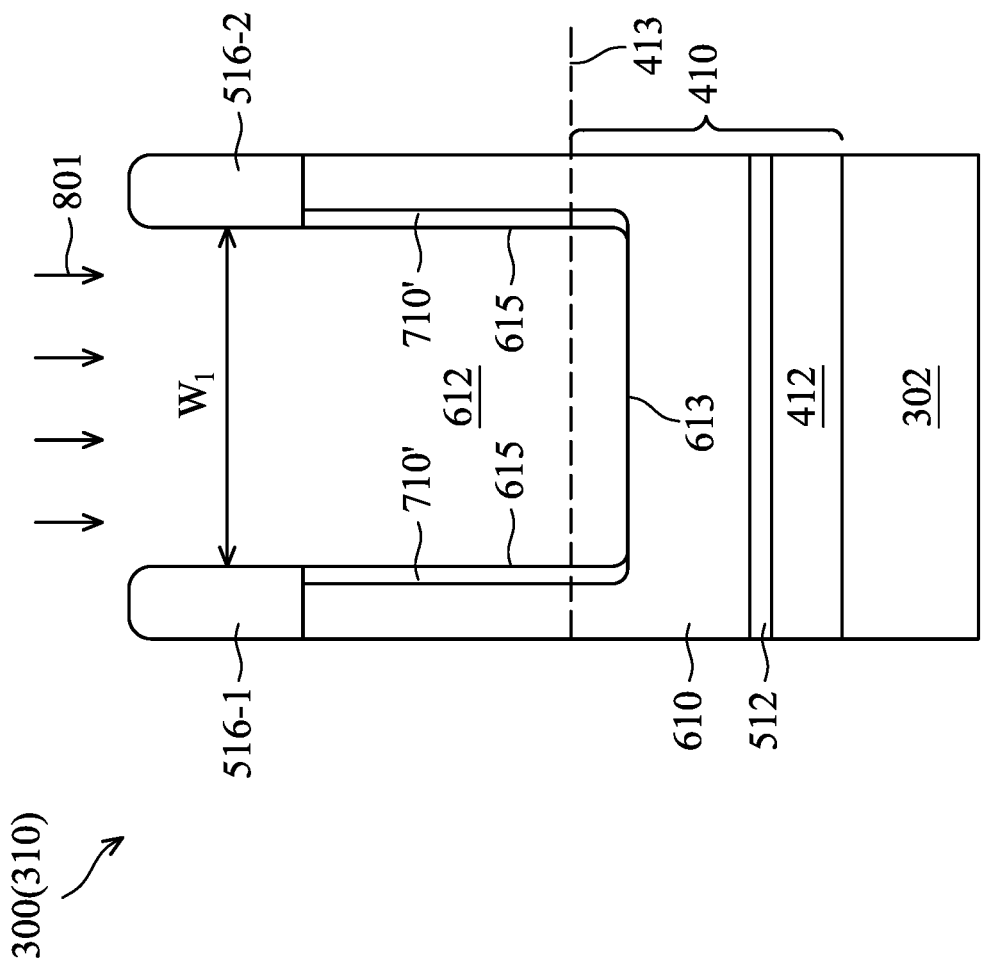

Corresponding to operation 212 of FIG. 2, FIG. 8A is a cross-sectional view of the FinFET device 300 including a patterned passivation layer 710' (in the high density area 310), and FIG. 7B is a cross-sectional view of the FinFET device 300 including a patterned passivation layer 750' (in the low density area 350), at one of the various stages of fabrication at one of the various stages of fabrication. The cross-sectional views of FIGS. 8A and 8B may be each cut along a direction parallel to the lengthwise direction of a respective semiconductor fin (e.g., cross-section C-C indicated in FIG. 1).

Figure 8B:
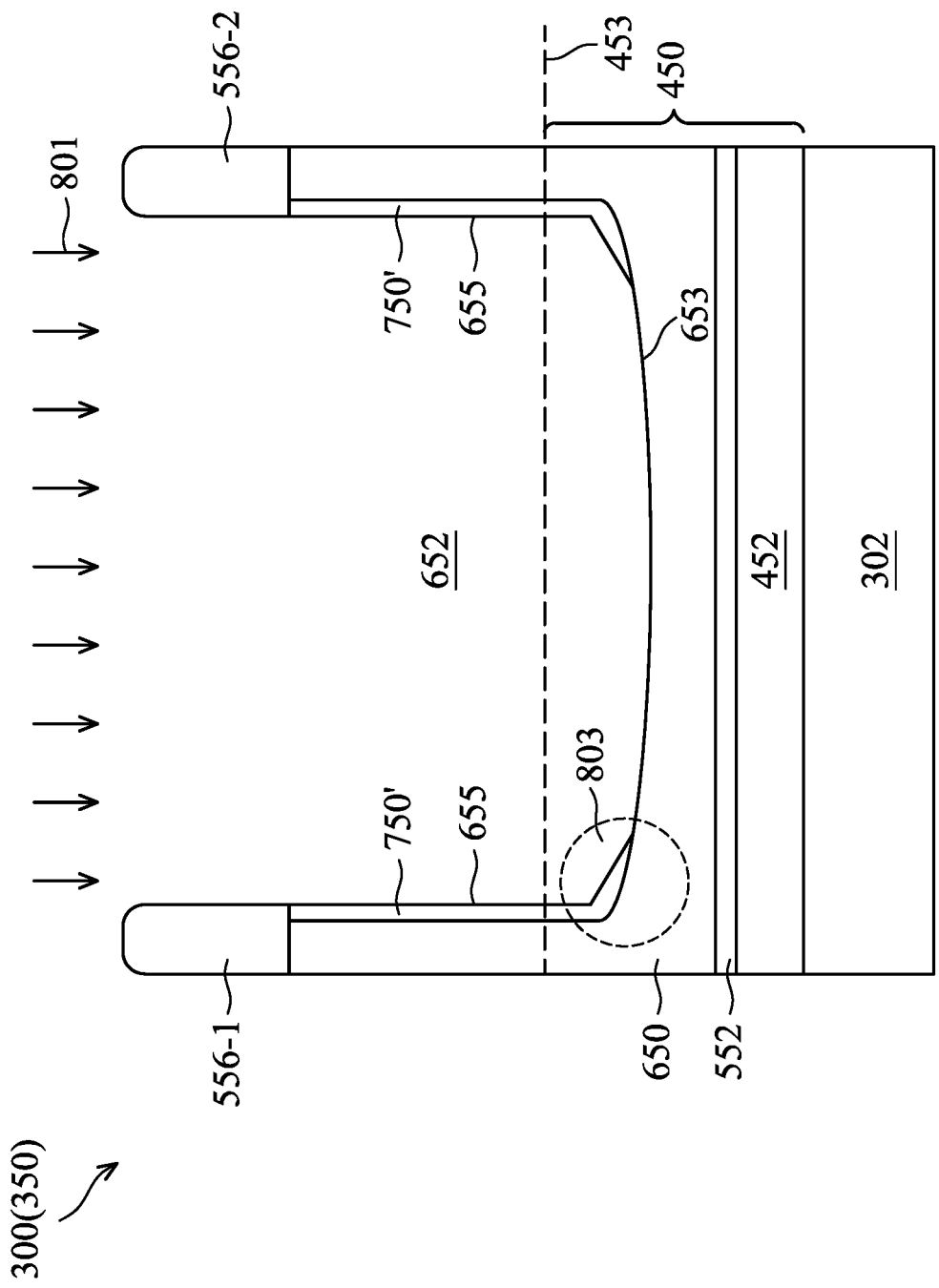

To form the patterned passivation layers 710' and 750', an etching process 801 may be performed on the passivation layer 710 (in the high density area 310) and the passivation layer 750 (in the low density area 350), respectively. The etching process 801 may be anisotropic. As such, a portion of the passivation layer 710 that overlays the bottom surface 613 (of the recess 612 formed in a vertical profile) may be almost removed, while leaving portions of the passivation layer 710 that respectively extend along the sidewalls 615 intact, as illustrated in FIG. 8A. Similarly, the etching process 801 can remove a portion of the passivation layer 750 that overlays a central portion of the bottom surface 653, while leaving portions of the passivation layer 750 that respectively extend along the sidewalls 655 intact. However, given the tapered profile of the recess 652, the remaining portions of the passivation layer 750 can each have an extended portion overlaying a portion of the bottom surface 653 that inwardly protrudes from one of the sidewalls 655, as enclosed by dotted circle 803 in FIG. 8B (sometimes referred to as extended portions 803). The extended portions 803 can point to each other. The extended portions 803 can later serve as a mask to form dummy gate structures having tip edges that are vertically away from (e.g., vertically above) their respective bottom surfaces (or the top surface of the isolation region 452) and point to each other. In some embodiments, the extended portions 803 may be vertically below the top surface 453 of the semiconductor fin 450, as illustrated in FIG. 8B.

Figure 9A:
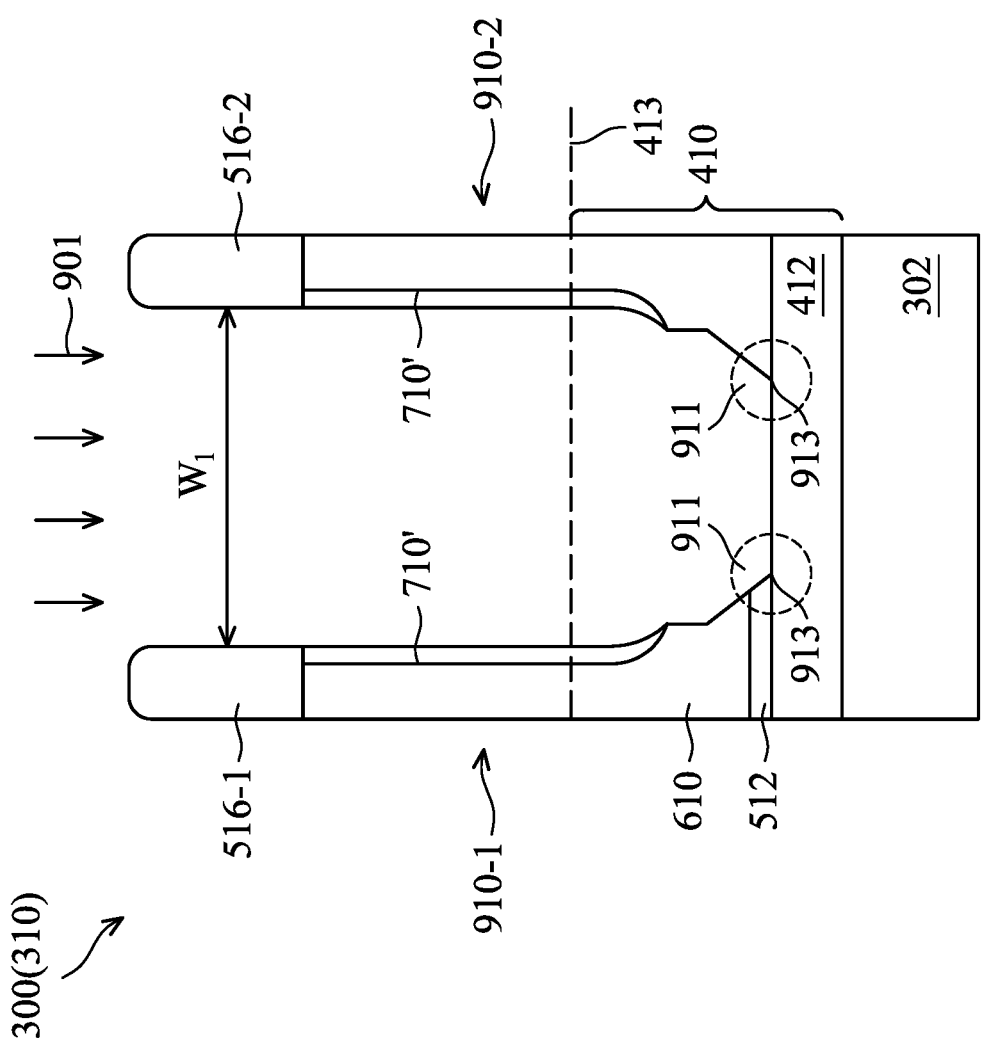
Figure 9B:
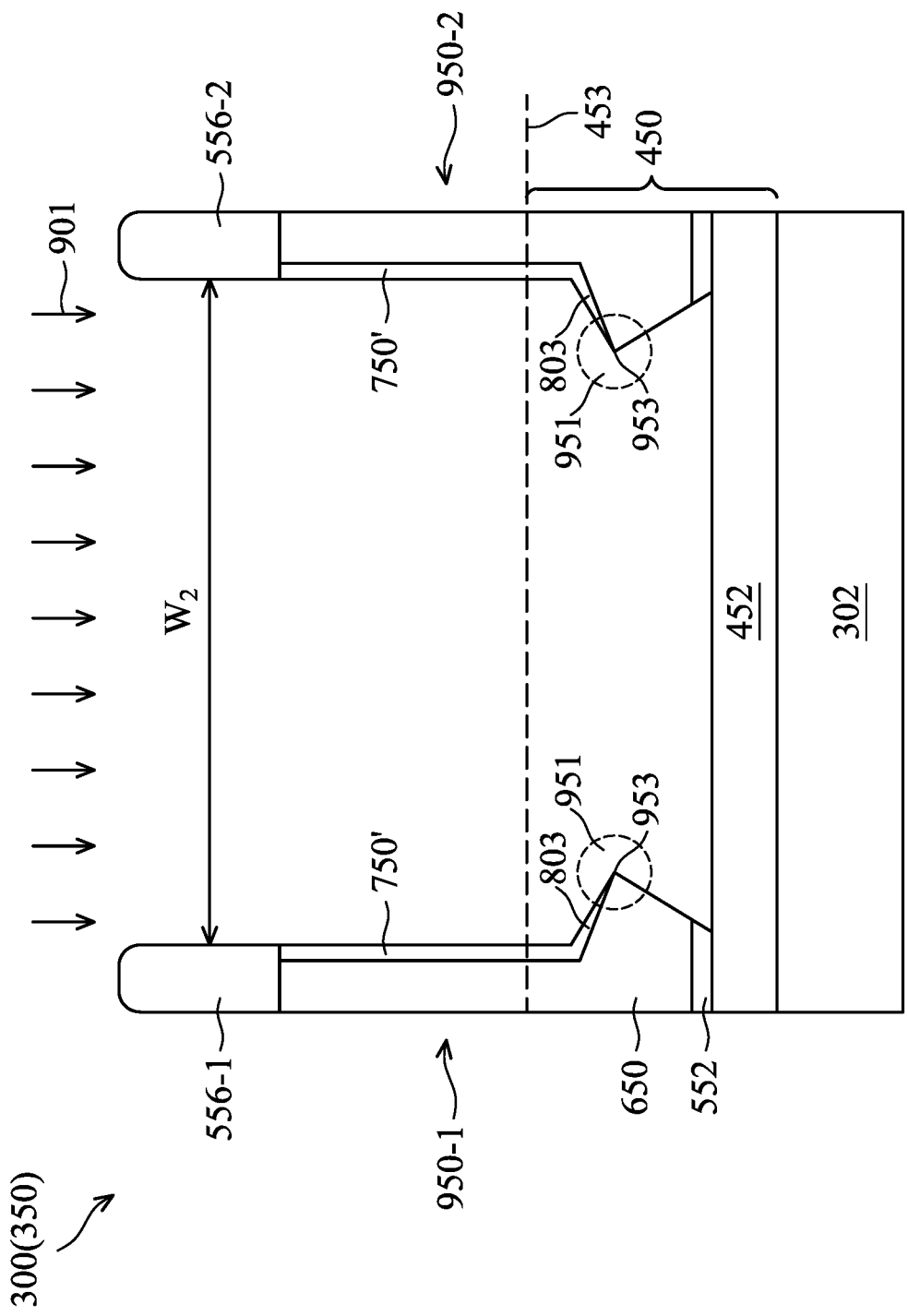

Corresponding to operation 214 of FIG. 2, FIG. 9A is a cross-sectional view of the FinFET device 300 including dummy gate structures 910-1 and 910-2 (in the high density area 310), and FIG. 9B is a cross-sectional view of the FinFET device 300 including dummy gate structures 950-1 and 950-2 (in the low density area 350), at one of the various stages of fabrication at one of the various stages of fabrication. The cross-sectional views of FIGS. 9A and 9B may be each cut along a direction parallel to the lengthwise direction of a respective semiconductor fin (e.g., cross-section C-C indicated in FIG. 1).

To form the dummy gate structures 910-1-2, an etching process 901 is performed on the intermediate dummy gate 610 and the dummy gate dielectric 512 (FIG. 8A), with the patterns 516-1-2 together with the patterned passivation layer 710' serving as a mask. Similarly, to form the dummy gate structures 950-1-2, the etching process 901 is performed on the intermediate dummy gate 650 and the dummy gate dielectric 552 (FIG. 8B), with the patterns 556-1-2 together with the patterned passivation layer 750' serving as a mask. The etching process 901 may be anisotropic.

Given the different spacings between the patterns 516-1-2 ($W_1$) and between the patterns 556-1-2 ($W_2$), the etching process 901 may etch the intermediate dummy gate 650 and the dummy gate dielectric 552 (in the low density area 350) at a faster rate than etch the intermediate dummy gate 610 and the dummy gate dielectric 512 (in the high density area 310). Further, due to the different profiles of the patterned passivation layers 710' and 750', the dummy gate structures 910-1-2 may respectively have extended portions that point to each other, as enclosed by dotted circle 911 in FIG. 9A (sometimes referred to as extended portions 911); and the dummy gate structures 950-1-2 may respectively have extended portions that point to each other, as enclosed by dotted circle 951 in FIG. 9B (sometimes referred to as extended portions 951). Still further, the extended portions 911 in the high density area 310 may each have a tip edge 913 (extending into and/or out of the illustrated cross-section) aligned with a bottom surface of the dummy gate structures 910-1-2 (or the top surface of the isolation region 412); and the extended portions 951 in the low density area 350 may each have a tip edge 953 (extending into and/or out of the illustrated cross-section) vertically away from a bottom surface of the dummy gate structures 950-1-2 (or the top surface of the isolation region 452). As such, in the high density area 310, the respective tip edges 913 of the dummy gate structures 910-1-2 may be separated by a spacing less than the spacing $W_1$ of the patterns 516-1-2, which in turn can increase a critical dimension of each of the dummy gate structures 910-1-2 (at its respective bottom portion). On the other hand, in the low density area 350, the respective tip edges 953 of the dummy gate structures 950-1-2 may be separated by a spacing less than the spacing $W_2$ of the patterns 556-1-2, which in turn can increase a critical dimension of each of the dummy gate structures 950-1-2 (at its respective extended portion).

Figure 10A:
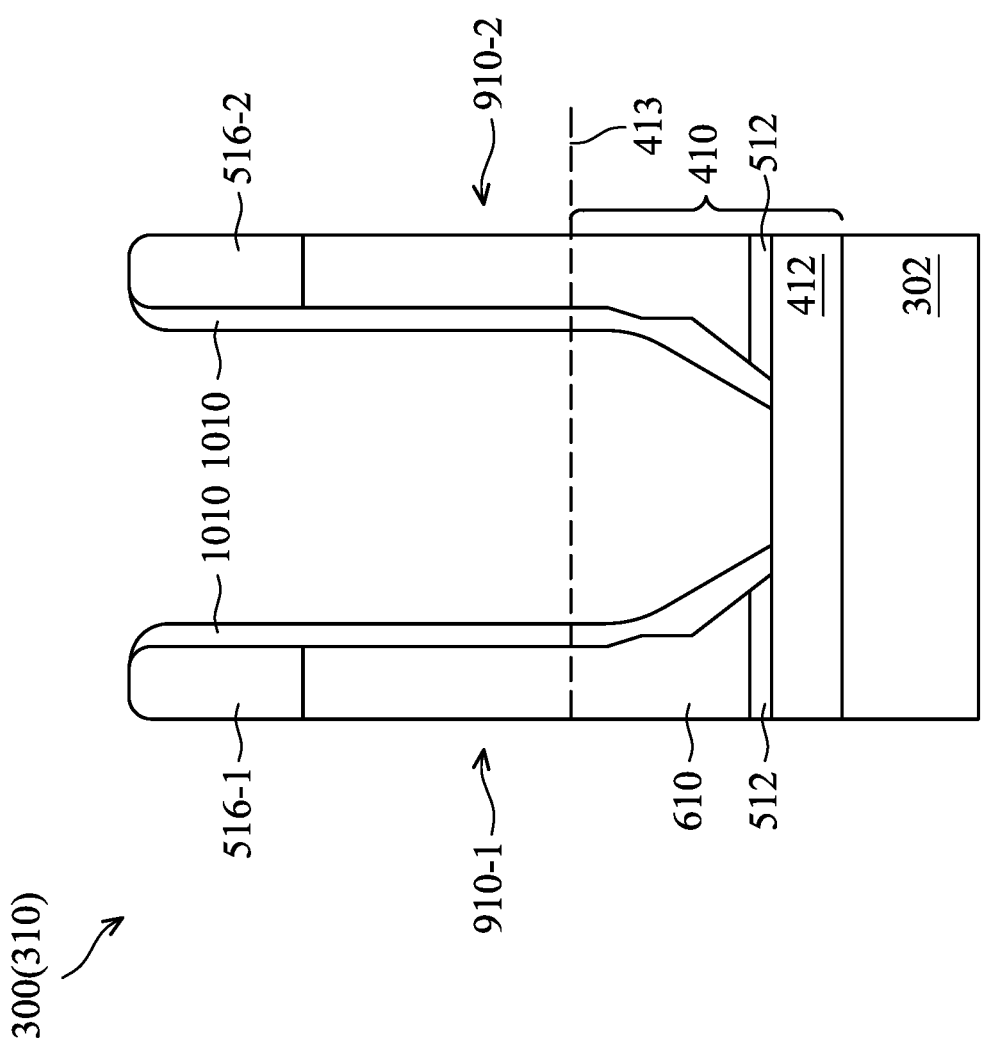
Figure 10B:
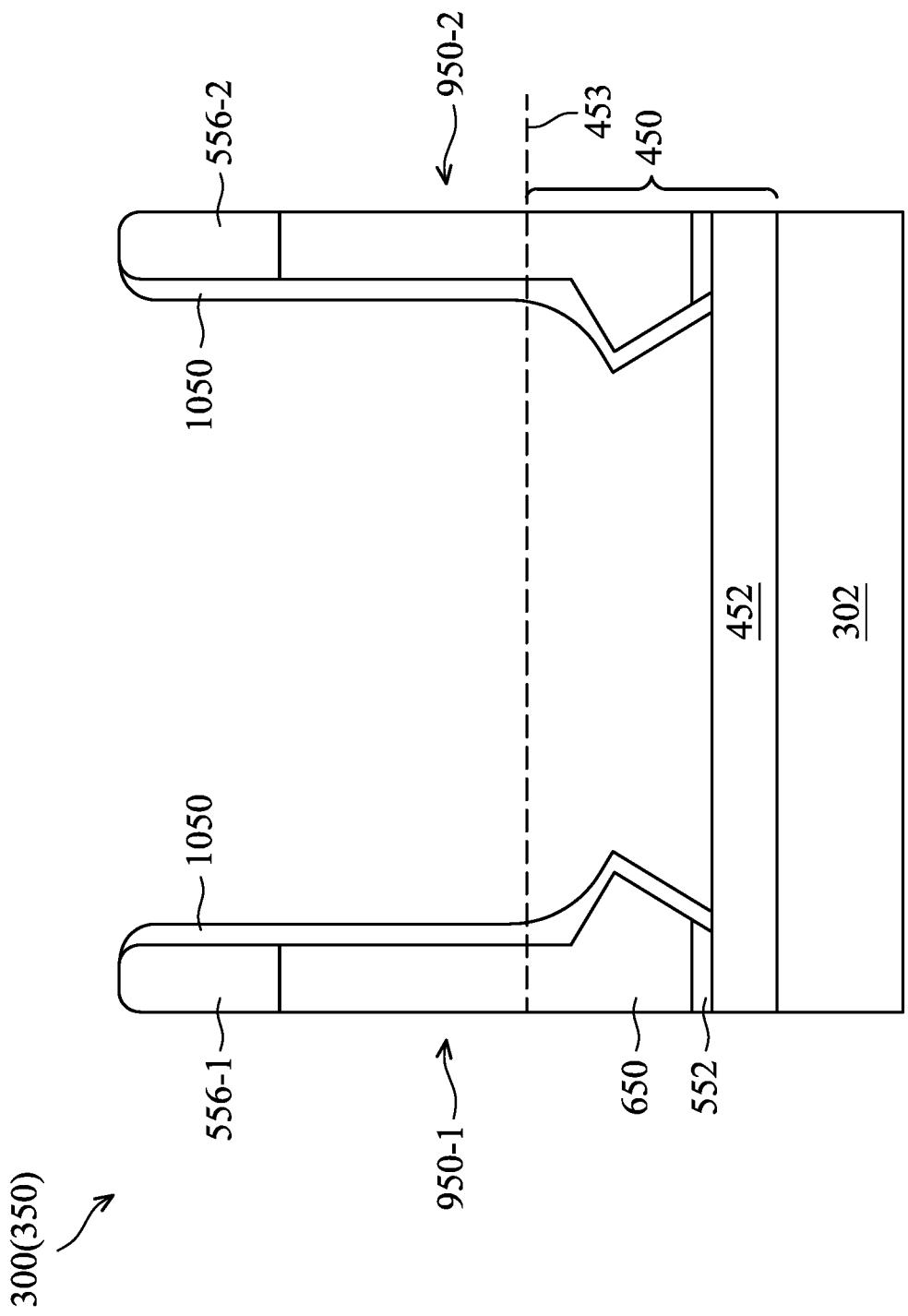

Corresponding to operation 216 of FIG. 2, FIG. 10A is a cross-sectional view of the FinFET device 300 including gate spacers 1010 (in the high density area 310), and FIG. 10B is a cross-sectional view of the FinFET device 300 including gate spacers 1050 (in the low density area 350), at one of the various stages of fabrication at one of the various stages of fabrication. The cross-sectional views of FIGS. 10A and 10B may be each cut along a direction parallel to the lengthwise direction of a respective semiconductor fin (e.g., cross-section C-C indicated in FIG. 1).

The gate spacer 1010 may be formed on opposing sidewalls of each of the dummy gate structures 910-1-2 (although only one sidewall of each of the dummy gate structures is shown in FIG. 10A); and the gate spacer 1050 may be formed on opposing sidewalls of each of the dummy gate structures 950-1-2 (although only one sidewall of each of the dummy gate structures is shown in FIG. 10B). Although the gate spacers 1010 and 1050 are each shown as a single layer in the illustrated examples of FIGS. 10A-B, it should be understood that the gate spacer 1010 and 1050 can each be formed as any number of layers while remaining within the scope of the present disclosure. In some embodiments, prior to forming the gate spacers 1010 and 1050, the patterned passivation layers 710' and 750' may be removed from the dummy gate structures 910-1-2 and 950-1-2, respectively, for example, by a wet etching process. In some embodiments, the patterned passivation layers 710' and 750' may remain during forming the gate spacers 1010 and 1050. For purposes of clarity, the patterned passivation layers 710' and 750' are not shown in FIGS. 10A-B (and the following figures).

The gate spacers 1010 and 1050 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacers 1010 and 1050. The shapes and formation methods of the gate spacers 1010 and 1050 as illustrated in FIGS. 10A-B are merely non-limiting examples, and other shapes and formation methods are possible. These and other variations are fully intended to be included within the scope of the present disclosure.

Figure 11A:
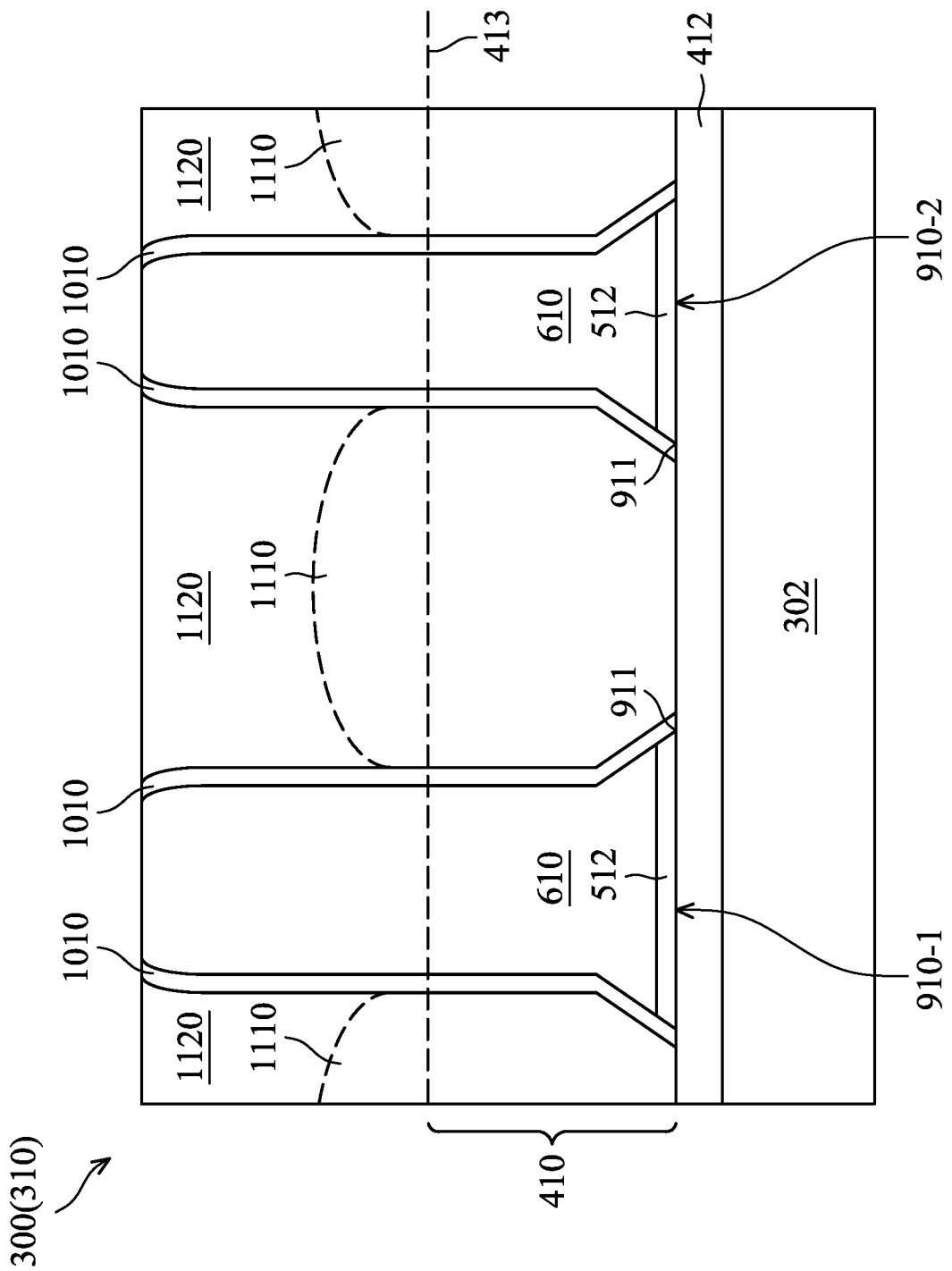
Figure 11B:
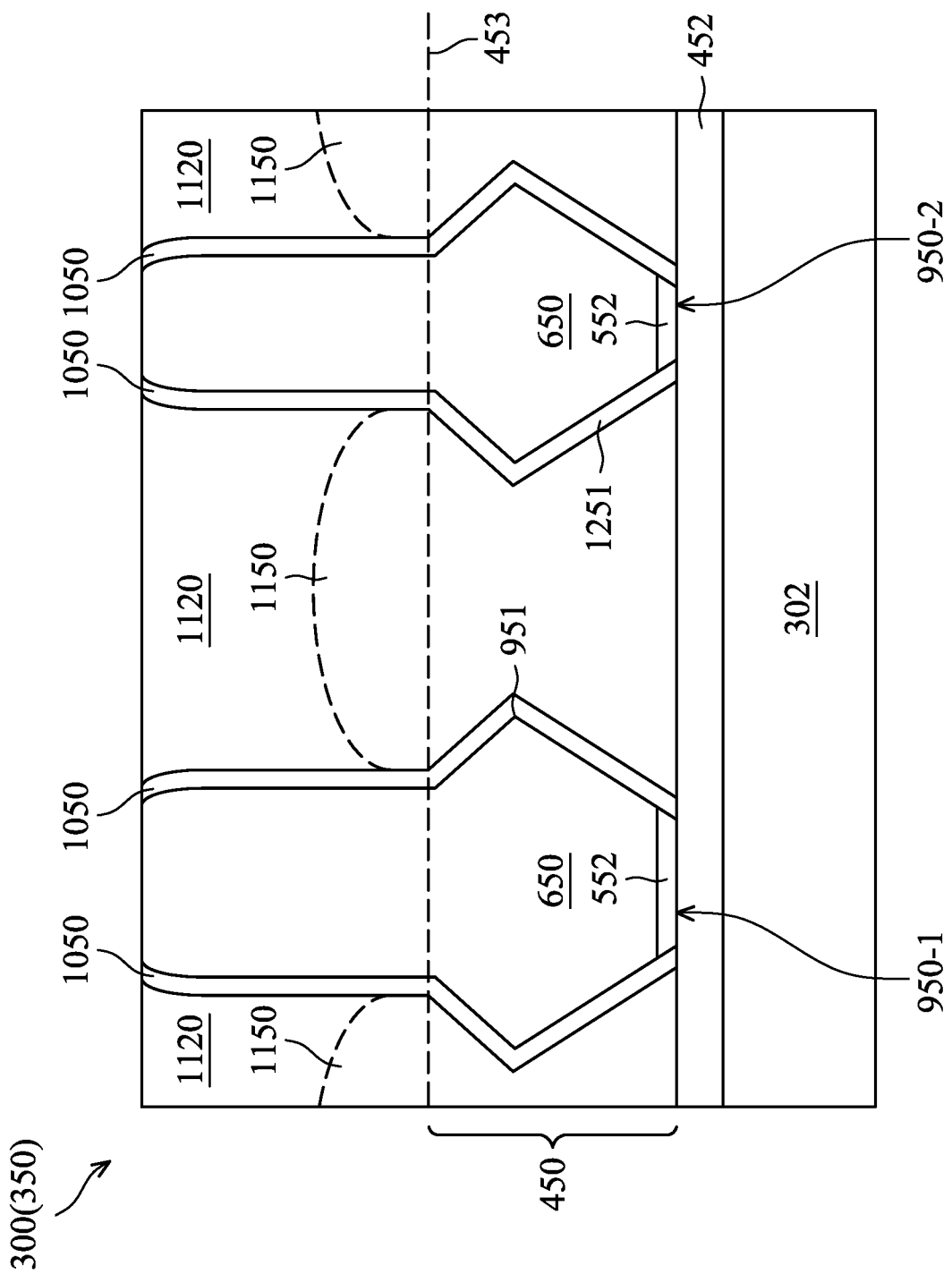

Corresponding to operation 218 of FIG. 2, FIG. 11A is a cross-sectional view of the FinFET device 300 including one or more source/drain structures 1110 (in the high density area 310), and FIG. 11B is a cross-sectional view of the FinFET device 300 including one or more source/drain structures 1150 (in the low density area 350), at one of the various stages of fabrication at one of the various stages of fabrication. The cross-sectional views of FIGS. 11A and 11B may be each cut along a direction parallel to the lengthwise direction of a respective semiconductor fin (e.g., cross-section C-C indicated in FIG. 1). Accordingly, the source/drain structures 1110 and 1150 may not be observable in these cross-sectional views, which are thus indicated by dotted lines in FIGS. 11A and 11B, respectively.

The source/drain structures 1110 are formed in recesses of the semiconductor fin 410 adjacent to the dummy gate structures 910-1-2, e.g., between adjacent dummy gate structures 910-1-2 and/or next to one of the dummy gate structures 910-1-2. Similarly, the source/drain structures 1150 are formed in recesses of the semiconductor fin 450 adjacent to the dummy gate structures 950-1-2, e.g., between adjacent dummy gate structures 950-1-2 and/or next to one of the dummy gate structures 950-1-2. The recesses are formed by, e.g., an anisotropic etching process using the dummy gate structures 910-1-2 and 950-1-2 as an etching mask, in some embodiments, although any other suitable etching process may also be used.

The source/drain structures 1110 and 1150 are formed by epitaxially growing a semiconductor material in the respective recesses, using suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof.

As illustrated in FIGS. 11A-B, the epitaxial source/drain structures 1110 and 1150 may have surfaces raised from the top surfaces 413 and 453 of the semiconductor fins, respectively. The epitaxial source/drain structures 1100 and 1150 may have facets. Further, each of the dummy gate structures 910-1-2 may have one or more portions (e.g., the tip edge 911) that each protrude toward a respective one of the source/drain structures 1110, with one of the gate spacers 1010 sandwiched therebetween; and each of the dummy gate structures 950-1-2 may have one or more portions (e.g., the tip edge 951) that each protrude toward a respective one of the source/drain structures 1150, with one of the gate spacers 1050 sandwiched therebetween.

In some embodiments, the source/drain structures 1110 and 1150 of the adjacent fins may merge to form a continuous epitaxial source/drain structure. In some embodiments, the source/drain structures 1110 and 1150 of the adjacent fins may not merge together and remain separate source/drain structures. In some embodiments, when the resulting FinFET device (e.g., 300) is an n-type FinFET, the source/drain structures 1100 and 1150 can include silicon carbide (SiC), silicon phosphorous (SiP), phosphorous-doped silicon carbon (SiCP), or the like. In some embodiments, when the resulting FinFET device (e.g., 300) is a p-type FinFET, the source/drain structures 1100 and 1150 comprise SiGe, and a p-type impurity such as boron or indium. The epitaxial source/drain structures 1110 and 1150 may be implanted with dopants, followed by an annealing process. The implanting process may include forming and patterning masks such as a photoresist to cover the regions of the FinFET device 300 that are to be protected from the implanting process. The source/drain structures 1110 and 1150 may have an impurity (e.g., dopant) concentration in a range from about $1 \times 10^{19}$ cm$^{-3}$ to about $1 \times 10^{21}$ cm$^{-3}$. P-type impurities, such as boron or indium, may be implanted in the source/drain structures 1300 of a P-type transistor. N-type impurities, such as phosphorous or arsenide, may be implanted in the source/drain structures 1300 of an N-type transistor. In some embodiments, the epitaxial source/drain structures 1300 may be in situ doped during their growth.

After forming the source/drain structures 1110 and 1150, a contact etch stop layer (CESL), not shown, can be formed over the workpiece, e.g., overlaying the source/drain structures 1110 and 1150. The CESL can function as an etch stop layer in a subsequent etching process, and may include a suitable material such as silicon oxide, silicon nitride, silicon oxynitride, combinations thereof, or the like, and may be formed by a suitable formation method such as CVD, PVD, combinations thereof, or the like.

Next, an interlayer dielectric (ILD) 1120 is formed over the CESL and over the dummy gate structures 910-1-2 and 950-1-2. In some embodiments, the ILD 1120 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1120 is formed, an optional dielectric layer (not shown) can be formed over the ILD 1120. The dielectric layer can function as a protection layer to prevent or reduces the loss of the ILD 1120 in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level upper surface for the dielectric layer, or the ILD 1120 (if no such a dielectric layer is formed). The CMP may also remove the patterns 516-1-2 and 556-1-2 and portions of the CESL disposed over the dummy gate structures. After the planarization process, a top surface of the dielectric layer or a top surface of the ILD 1120 is level with a top surface of the dummy gate structures 910-1-2 and 950-1-2, in some embodiments.

Figure 12A:
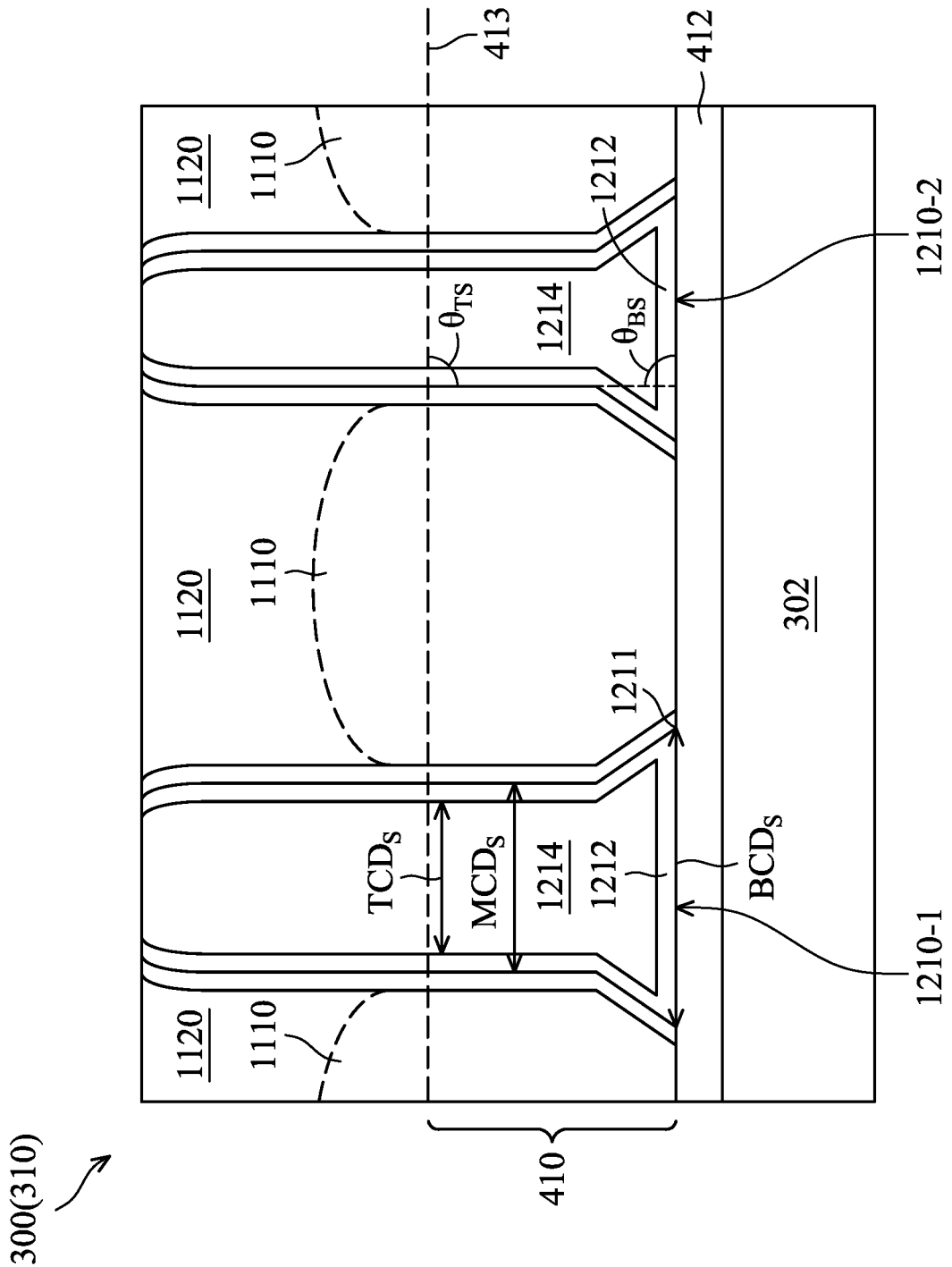
Figure 12B:
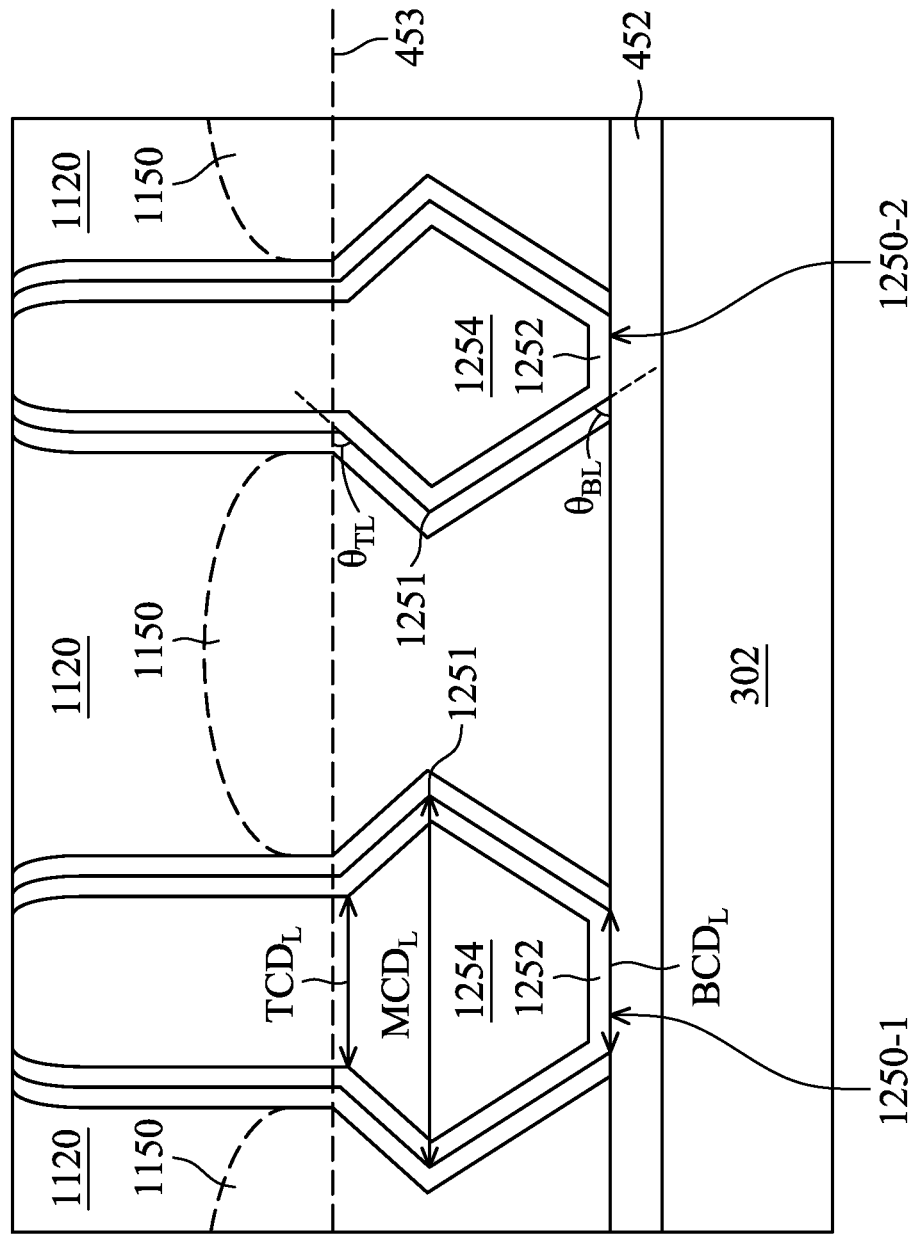

An example gate-last process (sometimes referred to as replacement gate process) can then performed to replace each of the dummy gate structures 910-1-2 and 950-1-2 with an active gate structure (which may also be referred to as a replacement gate structure or a metal gate structure). FIGS. 12A and 12B illustrate the cross-sectional views of further processing (or making) of the FinFET device 300, which will be discussed in more detail as follows.

Corresponding to operation 220 of FIG. 2, FIG. 12A is a cross-sectional view of the FinFET device 300 including active gate structures 1210-1 and 1210-2 (in the high density area 310), and FIG. 12B is a cross-sectional view of the FinFET device 300 including active gate structures 1250-1 and 1250-2 (in the low density area 350), at one of the various stages of fabrication at one of the various stages of fabrication. The cross-sectional views of FIGS. 12A and 12B may be each cut along a direction parallel to the lengthwise direction of a respective semiconductor fin (e.g., cross-section C-C indicated in FIG. 1). Accordingly, the source/drain structures 1110 and 1150 may not be observable in these cross-sectional views, which are thus indicated by dotted lines in FIGS. 12A and 12B, respectively.

In the high density area 310, the active gate structures 1210-1 and 1210-2 may be formed by replacing the dummy gate structures 910-1 and 910-2, respectively; and in the low density area 350, the active gate structures 1250-1 and 1250-2 may be formed by replacing the dummy gate structures 950-1 and 950-2, respectively. As such, the active gate structures 1210-1 and 1210-2 can inherit the profiles (and dimensions) of the dummy gate structures 910-1 and 910-2, respectively; and the active gate structures 1250-1 and 1250-2 can inherit the profiles (and dimensions) of the dummy gate structures 950-1 and 950-2, respectively. The profiles of the active gate structures 1210-1-2 and 1250-1-2 will be respectively discussed in further detail as follows.

As illustrated in FIG. 12A, each of the active gate structures 1210-1-2 can have a tip edge 1211 one each of its opposing sides. Adjacent active gate structures, e.g., 1210-1 and 1210-2 shown in FIG. 12A, can have their respective top edges pointing to each other. In some embodiments, such tip edges may be vertically aligned with respective bottom surface of the active gate structures 1210-1-2 (or the top surface of the isolation region 412).

In some embodiments, the active gate structures 1210-1-2 can each be characterized with a number of critical dimensions. For example, the active gate structures 1210-1-2 includes critical dimensions: TCDs, MCDs, and BCDs. TCDs can refer to a distance between the sidewalls of the active gate structure 1210-1/1210-2 around a position vertically aligned with the top surface 413 of the semiconductor fin 410; BCDs can refer to a distance between the sidewalls of the active gate structure 1210-1/1210-2 around a position vertically aligned with the bottom surface of the active gate structures 1210-1-2; and MCDs can refer to a distance between the sidewalls of the active gate structure 1210-1/1210-2 around a position vertically between the top surface 413 of the semiconductor fin 410 and the bottom surface of the active gate structures 1210-1-2. In some embodiments, these critical dimensions may have a ratio with respect to one another. For example, TCDs:MCDs:BCDs may be about 1:1 (ranging from 0.85 to about 1.15):1.05 (ranging from about 1.03 to about 1.3). Further, each of the sidewalls of the active gate structures 1210-1-2 and the top surface 413 can form an angle, $\theta_{TS}$, and each of the sidewalls and the bottom surface of the active gate structures 1210-1-2 can form an angle, $\theta_{BS}$, as illustrated in FIG. 12A. For example, $\theta_{TS}$ may range from about 65° to about 115°; and $\theta_{BS}$ may range from about 55° to about 105°.

As illustrated in FIG. 12B, each of the active gate structures 1250-1-2 can have a tip edge 1251 one each of its opposing sides. Adjacent active gate structures, e.g., 1250-1 and 1250-2 shown in FIG. 12B, can have their respective top edges pointing to each other. In some embodiments, such tip edges may be vertically away from respective bottom surface of the active gate structures 1250-1-2 (or the top surface of the isolation region 452).

In some embodiments, the active gate structures 1250-1-2 can each be characterized with a number of critical dimensions. For example, the active gate structures 1250-1-2 includes critical dimensions: $TCD_L$, $MCD_L$, and $BCD_L$. $TCD_L$ can refer to a distance between the sidewalls of the active gate structure 1250-1/1250-2 around a position vertically aligned with the top surface 453 of the semiconductor fin 450; $BCD_L$ can refer to a distance between the sidewalls of the active gate structure 1250-1/1250-2 around a position vertically aligned with the bottom surface of the active gate structures 1250-1-2; and $MCD_L$ can refer to a distance between the sidewalls of the active gate structure 1250-1/1250-2 around a position vertically between the top surface 453 of the semiconductor fin 450 and the bottom surface of the active gate structures 1250-1-2. In some embodiments, these critical dimensions may have a ratio with respect to one another. For example, $TCD_L$:$MCD_L$:$BCD_L$ may be about 1:1.1 (ranging from 1.05 to about 1.35):0.95 (ranging from about 0.85 to about 1.15). Further, each of the sidewalls of the active gate structures 1250-1-2 and the top surface 453 can form an angle, $\theta_{TL}$; and each of the sidewalls and the bottom surface of the active gate structures 1250-1-2 can form an angle, $\theta_{BL}$, as illustrated in FIG. 12B. For example, $\theta_{TL}$ may range from about 60° to about 110°; and $\theta_{BL}$ may range from about 60° to about 110°.

After the active gate structures 1210-1-2 and 1250-1-2 are formed, the FinFET device 300 can include a number of transistors. For example, a first core transistor, adopting a portion the semiconductor fin 410 as its conduction channel and the active gate structure 1210-1 as its gate, may be formed; a second core transistor, adopting another portion the semiconductor fin 410 as its conduction channel and the active gate structure 1210-2 as its gate, may be formed; a first I/O transistor, adopting a portion the semiconductor fin 450 as its conduction channel and the active gate structure 1250-1 as its gate, may be formed; and a second I/O transistor, adopting a portion the semiconductor fin 450 as its conduction channel and the active gate structure 1250-2 as its gate, may be formed.

The active gate structures 1210-1 through 12102 can each include a gate dielectric layer 1212, a metal gate layer 1214, and one or more other layers that are not shown for clarity; and the active gate structures 1250-1 through 1250-2 can each include a gate dielectric layer 1252, a metal gate layer 1254, and one or more other layers that are not shown for clarity. For example, each of the active gate structures 1210-1-2 and 1250-1-2 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layers 1212 and 1252 are each formed in a respective gate trench to surround (e.g., straddle) one or more fins. In an embodiment, the gate dielectric layer 1212 can be a remaining portion of the dummy gate dielectric 512; and the gate dielectric layer 1252 can be a remaining portion of the dummy gate dielectric 552. In another embodiment, the gate dielectric layer 1212 can be formed by removing the dummy gate dielectric 512, followed by conformal deposition or thermal reaction; and the gate dielectric layer 1252 can be formed by removing the dummy gate dielectric 552, followed by conformal deposition or thermal reaction. In yet another embodiment, the gate dielectric layer 1212 can be formed by removing the dummy gate dielectric 512, followed by no further processing step (i.e., the gate dielectric layer 512 may be a native oxide over the semiconductor fin 410); and the gate dielectric layer 1252 can be formed by removing the dummy gate dielectric 552, followed by no further processing step (i.e., the gate dielectric layer 552 may be a native oxide over the semiconductor fin 450). The following discussions (and the illustrated examples of FIG. 12A-B) are directed to the gate dielectric layers 1212 and 1252 formed by removing the respective dummy gate dielectrics and performing conformal deposition.

For example, the gate dielectric layer 1212 of the active gate structure 1210-1 is deposited in a gate trench that is formed by removing the dummy gate structure 910-1. The gate dielectric layer 1212 can straddle the active fin 410 by overlaying a portion of its top surface and portions of its sidewalls. The gate dielectric layer 1212 of the active gate structure 1210-2 is deposited in a gate trench that is formed by removing the dummy gate structure 910-2. The gate dielectric layer 1212 can straddle the active fin 410 by overlaying another portion of its top surface and another portions of its sidewalls. The gate dielectric layer 1252 of the active gate structure 1250-1 is deposited in a gate trench that is formed by removing the dummy gate structure 950-1. The gate dielectric layer 1252 can straddle the active fin 450 by overlaying a portion of its top surface and portions of its sidewalls. The gate dielectric layer 1252 of the active gate structure 1250-2 is deposited in a gate trench that is formed by removing the dummy gate structure 950-2. The gate dielectric layer 1252 can straddle the active fin 450 by overlaying another portion of its top surface and another portions of its sidewalls.

The gate dielectric layers 1212 and 1252 each include silicon oxide, silicon nitride, or multilayers thereof. In example embodiments, the gate dielectric layers 1212 and 1252 each include a high-k dielectric material, and in these embodiments, the gate dielectric layers may have a k value greater than about 7.0, and may include a metal oxide or a silicate of Hf, Al, Zr, La, Mg, Ba, Ti, Pb, or combinations thereof. The formation methods of gate dielectric layers 1212 and 1252 may include molecular beam deposition (MBD), atomic layer deposition (ALD), PECVD, and the like. A thickness of the gate dielectric layers 1212 and 1252 may be between about 8 Å and about 20 Å, as an example.

The metal gate layer 1214 and 1254 formed over the gate dielectric layers 1212 and 1252, respectively. The metal gate layers 1214 of the active gate structures 1210-1-2 are deposited in the gate trenches over the gate dielectric layer 1212, respectively; and the metal gate layers 1254 of the active gate structures 1250-1-2 are deposited in the gate trenches over the gate dielectric layer 1252, respectively. The metal gate layers 1214 and 1254 may each be a P-type work function layer, an N-type work function layer, multi-layers thereof, or combinations thereof, in some embodiments. Accordingly, the metal gate layer is sometimes referred to as a work function layer.

In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

In one aspect of the present disclosure, a semiconductor device is disclosed. The semiconductor device includes a substrate. The semiconductor device includes a fin that is formed over the substrate and extends along a first direction. The semiconductor device includes a gate structure that straddles the fin and extends along a second direction perpendicular to the first direction. The semiconductor device includes a first source/drain structure coupled to a first end of the fin along the first direction. The gate structure includes a first portion protruding toward the first source/drain structure along the first direction. A tip edge of the first protruded portion is vertically above a bottom surface of the gate structure.

In another aspect of the present disclosure, a semiconductor device is disclosed. The semiconductor device includes a substrate including a first area and a second area. In the first area, the semiconductor device includes: a first fin that is formed over the substrate and extends along a first direction; a first gate structure that straddles the first fin and extends along a second direction perpendicular to the first direction; and a first source/drain structure coupled to the first fin along the first direction. The first gate structure includes a first portion protruding toward the first source/drain structure along the first direction. A tip edge of the first protruded portion of the first gate structure is vertically aligned with a bottom surface of the first gate structure. In the second area, the semiconductor device includes: a second fin that is formed over the substrate and extends along the first direction; a second gate structure that straddles the second fin and extends along the second direction; and a second source/drain structure coupled to the second fin along the first direction. The second gate structure includes a first portion protruding toward the second source/drain structure along the first direction. A tip edge of the first protruded portion of the second gate structure is vertically above a bottom surface of the second gate structure.

In yet another aspect of the present disclosure, a method of making a semiconductor device is disclosed. The method includes forming a blanket dummy gate over a fin, wherein the fin extends along a first direction. The method includes patterning the blanket dummy gate to form a recess that has a bottom surface and sidewalls. Each of the sidewalls and the bottom surface form a varying angle when moving along the bottom surface. The method includes patterning a passivation layer over the recess. The patterned passivation layer include a plurality of first portions and a plurality of second portions. The plurality of first portions respectively extend along the sidewalls of the recess and the plurality of second portions respectively protrude from the first portions toward each other. The method includes etching, with the patterned passivation layer as a mask, a remaining portion of the blanket dummy gate to form a first dummy gate structure and a second dummy gate structure. The first and second dummy gate structures include a first tip edge and a second tip edge, respectively, and wherein the first and second tip edges point to each other and are vertically above a bottom surface of the first and second dummy gate structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate;
    a fin that is formed over the substrate and extends along a first direction;
    a gate structure that straddles the fin and extends along a second direction perpendicular to the first direction; and
    a first source/drain structure coupled to a first end of the fin;
    wherein the gate structure includes a first portion protruding into the first source/drain structure along the first direction, and wherein a tip edge of the first protruded portion is vertically above a bottom surface of the gate structure.

2. The semiconductor device of claim 1, wherein the tip edge of the first protruded portion is vertically below a top surface of the fin.

3. The semiconductor device of claim 1, wherein the first protruded portion includes a first surface and a second surface merging with each other at the tip edge of the first protruded portion.

4. The semiconductor device of claim 3, wherein the first surface of the first protruded portion and a top surface of the fin form a first angle therebetween, and the second surface of the first protruded portion and the bottom surface of the gate structure form a second angle therebetween, and wherein each of the first and second angles is less than 90 degrees.

5. The semiconductor device of claim 1, further comprising a second source/drain structure coupled to a second end of the fin along the first direction, wherein the gate structure includes a second portion protruding toward the second source/drain structure along the first direction, and wherein a tip edge of the second protruded portion is vertically above the bottom surface of the gate structure.

6. The semiconductor device of claim 4, wherein a distance between the tip edge of the first protruded portion and the tip edge of the second protruded portion along the first direction is greater than any other distance between respective sidewalls of the gate structure along the first direction.

7. The semiconductor device of claim 1, further comprising a spacer extending along a sidewall of the gate structure, wherein the spacer includes a portion following a profile of the first protruded portion of the gate structure.

8. The semiconductor device of claim 1, wherein the tip edge of the first protruded portion is vertically below a top surface of the first source/drain structure.

9. A semiconductor device, comprising:
    a substrate including a first area and a second area;
    wherein the semiconductor device in the first area comprises:
        a first fin that is formed over the substrate and extends along a first direction;
        a first gate structure that straddles the first fin and extends along a second direction perpendicular to the first direction; and
        a first source/drain structure coupled to the first fin along the first direction;
    wherein the first gate structure includes a first portion protruding into the first source/drain structure along the first direction, and wherein a tip edge of the first protruded portion of the first gate structure is vertically aligned with a bottom surface of the first gate structure; and
    wherein the semiconductor device in the second area comprises:
        a second fin that is formed over the substrate and extends along the first direction;
        a second gate structure that straddles the second fin and extends along the second direction; and
        a second source/drain structure coupled to the second fin along the first direction;
    wherein the second gate structure includes a first portion protruding into the second source/drain structure along the first direction, and wherein a tip edge of the first protruded portion of the second gate structure is vertically above a bottom surface of the second gate structure.

10. The semiconductor device of claim 9, wherein a first density of transistors formed in the first area is greater than a second density of transistors formed in the second area.

11. The semiconductor device of claim 9, further comprising:
a third source/drain structure coupled to the first fin along the first direction, wherein the first gate structure includes a second portion protruding toward the third source/drain structure along the first direction, and wherein a tip edge of the second protruded portion of the first gate structure is vertically aligned with the bottom surface of the first gate structure; and
a fourth source/drain structure coupled to the second fin along the first direction, wherein the second gate structure includes a second portion protruding toward the fourth source/drain structure along the first direction, and wherein a tip edge of the second protruded portion of the second gate structure is vertically above the bottom surface of the second gate structure.

12. The semiconductor device of claim 11, wherein a distance between the tip edges of the first and second protruded portions of the first gate structure along the first direction is greater than any other distance between respective sidewalls of the first gate structure along the first direction.

13. The semiconductor device of claim 11, wherein a distance between the tip edges of the first and second protruded portions of the second gate structure along the first direction is greater than any other distance between respective sidewalls of the second gate structure along the first direction.

14. The semiconductor device of claim 9, wherein the tip edge of the first protruded portion of the first gate structure is vertically below a top surface of the first fin, and the tip edge of the first protruded portion of the second gate structure is vertically below a top surface of the second fin.

15. The semiconductor device of claim 9, in the first area, further comprising a third gate structure that straddles the first fin and extends in parallel with the first gate structure, wherein the third gate structure includes a first portion protruding toward the first source/drain structure along the first direction, and wherein a tip edge of the first protruded portion of the third gate structure is vertically aligned with a bottom surface of the third gate structure and the bottom surface of the first gate structure.

16. The semiconductor device of claim 15, in the second area, further comprising a fourth gate structure that straddles the second fin and extends in parallel with the second gate structure, wherein the fourth gate structure includes a first portion protruding toward the second source/drain structure along the first direction, and wherein a tip edge of the first protruded portion of the fourth gate structure is vertically above a bottom surface of the fourth gate structure and the bottom surface of the second gate structure.

17. The semiconductor device of claim 16, wherein a first spacing separating the first and third gate structures from each other along the first direction is less than a second spacing separating the second and fourth gate structures from each other along the first direction.

18. A semiconductor device, comprising:
a substrate;
a fin formed over the substrate and extends along a first direction;
a first gate structure straddling a first portion of the fin and extending along a second direction perpendicular to the first direction;
a second gate structure straddling a second portion of the fin and also extending along the second direction; and
a source/drain structure formed in the fin, and interposed between the first and second gate structures;
wherein the first gate structure includes a first portion protruding into the source/drain structure along the first direction, and wherein a tip edge of the first protruded portion is vertically above a bottom surface of the gate structure;
wherein the second gate structure includes a second portion also protruding into the source/drain structure along the first direction, and wherein a tip edge of the second protruded portion is vertically above the bottom surface of the gate structure.

19. The semiconductor device of claim 18, wherein the source/drain structure includes at least a portion formed above an isolation region.

20. The semiconductor device of claim 18, wherein the tip edge of the first protruded portion and the tip edge of the second protruded portion point to each other.

* * * * *